(12) United States Patent
Kobayashi

(10) Patent No.: US 11,662,367 B2
(45) Date of Patent: May 30, 2023

(54) INSPECTION APPARATUS AND INSPECTION METHOD

(71) Applicant: Tokyo Electron Limited, Tokyo (JP)

(72) Inventor: Masahito Kobayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/350,109

(22) Filed: Jun. 17, 2021

(65) Prior Publication Data

US 2021/0405089 A1 Dec. 30, 2021

(30) Foreign Application Priority Data

Jun. 30, 2020 (JP) .............................. JP2020-113515
Mar. 16, 2021 (JP) .............................. JP2021-042867

(51) Int. Cl.
  *G01R 1/04* (2006.01)
  *G01R 1/067* (2006.01)
  *G01R 1/073* (2006.01)
  *G01R 31/28* (2006.01)

(52) U.S. Cl.
  CPC ..... *G01R 1/07342* (2013.01); *G01R 31/2887* (2013.01); *G01R 31/2891* (2013.01)

(58) Field of Classification Search
  CPC .......... G01R 1/04; G01R 1/067; G01R 1/073; G01R 31/00; G01R 31/02; G01R 31/28; G01R 31/26; G01R 31/31
  See application file for complete search history.

(56) References Cited

U.S. PATENT DOCUMENTS

| | | | | |
|---|---|---|---|---|
| 6,124,725 A | * | 9/2000 | Sato | G01R 31/2851 324/754.03 |
| 6,140,828 A | * | 10/2000 | Iino | G01R 31/2887 324/750.22 |
| 2002/0075661 A1 | * | 6/2002 | Ambe | H05K 13/0486 361/760 |
| 2009/0212803 A1 | * | 8/2009 | Yamamoto | G01R 31/2893 324/762.06 |
| 2019/0353701 A1 | * | 11/2019 | Hamada | G01R 31/2887 |

FOREIGN PATENT DOCUMENTS

JP    2014-029916    2/2014

* cited by examiner

*Primary Examiner* — Neel D Shah
(74) *Attorney, Agent, or Firm* — IPUSA, PLLC

(57) ABSTRACT

An inspection apparatus includes: a probe card having a probe to be in contact with an object to be inspected; an upper module having a mounting portion on which the object to be inspected is mounted; a movement mechanism that is configured to support the upper module to be liftable and lowerable and that is able to move the upper module in a horizontal direction; and a lifting and lowering mechanism that is provided under the movement mechanism and that is able to push up the upper module toward the probe card, wherein an axis passing through a point of action of a pushing force when the lifting and lowering mechanism pushes up the upper module and an axis passing through a point of action of a load received by the probe card are arranged at positions to be common.

7 Claims, 22 Drawing Sheets

INSPECTION APPARATUS AND INSPECTION METHOD

CROSS-REFERENCE TO RELATED APPLICATION

The present application is based upon and claims priority to Japanese Patent Application No. 2020-113515, filed on Jun. 30, 2020 and Japanese Patent Application No. 2021-042867, filed on Mar. 16, 2021, the entire contents of which are incorporated herein by reference.

BACKGROUND OF THE INVENTION

1. Field of the Invention

The present disclosure relates to an inspection apparatus and an inspection method.

2. Description of the Related Art

There is a known inspection apparatus that mounts, on a stage, a wafer on which an electronic device is formed or a carrier on which an electronic device carrier is arranged and that causes probes of a probe card to be in contact with an electrode of the electronic device to inspect electrical characteristics of the electronic device.

Patent Document 1 describes a device of contacting a substrate with a probe card of a substrate inspection interface provided in a substrate inspection apparatus including an inspection unit that performs electrical characteristic inspection on semiconductor devices formed on the substrate and the substrate inspection interface provided at an upper portion of the inspection unit, the device comprising: a transferring device configured to transfer the substrate together with a plate-shaped member to a position facing the probe card; a contacting device configured to move the substrate transferred by the transferring device together with the plate-shaped member toward the probe card to bring multiple electrodes of the semiconductor devices formed on the substrate into contact with multiple probes provided on the probe card, respectively and configured to further move the substrate together with the plate-shaped member by a preset amount toward the probe card; a holding device configured to hold a contact state between the multiple electrodes of the semiconductor devices and the multiple probes of the probe card by depressurizing a space between the probe card and the plate-shaped member; and a separating device configured to separate the transferring device from the plate-shaped member after the contact state is held by the holding device.

PRIOR ART DOCUMENT

Patent Document

[Patent Document 1] Japanese Laid-open Patent Publication No. 2014-29916

Here, when a probe is caused to be in contact with the outer periphery of a wafer or a carrier, an offset may occur between the center of gravity of the press load from a probe card and the center of a supporting stage, which may cause the stage to fall down.

One aspect of the present disclosure provides an inspection apparatus and an inspection method to suppress falling down of a stage.

SUMMARY OF THE INVENTION

In view of the above, according to one aspect, an inspection apparatus includes: a probe card having a probe to be in contact with an object to be inspected; an upper module having a mounting portion on which the object to be inspected is mounted; a movement mechanism that is configured to support the upper module to be liftable and lowerable and that is able to move the upper module in a horizontal direction; and a lifting and lowering mechanism that is provided under the movement mechanism and that is able to push up the upper module toward the probe card, wherein an axis passing through a point of action of a pushing force when the lifting and lowering mechanism pushes up the upper module and an axis passing through a point of action of a load received by the probe card are arranged at positions to be common.

One aspect of the present disclosure provides an inspection apparatus and an inspection method to suppress falling down of a stage.

DESCRIPTION OF THE EMBODIMENTS

Figure 1:
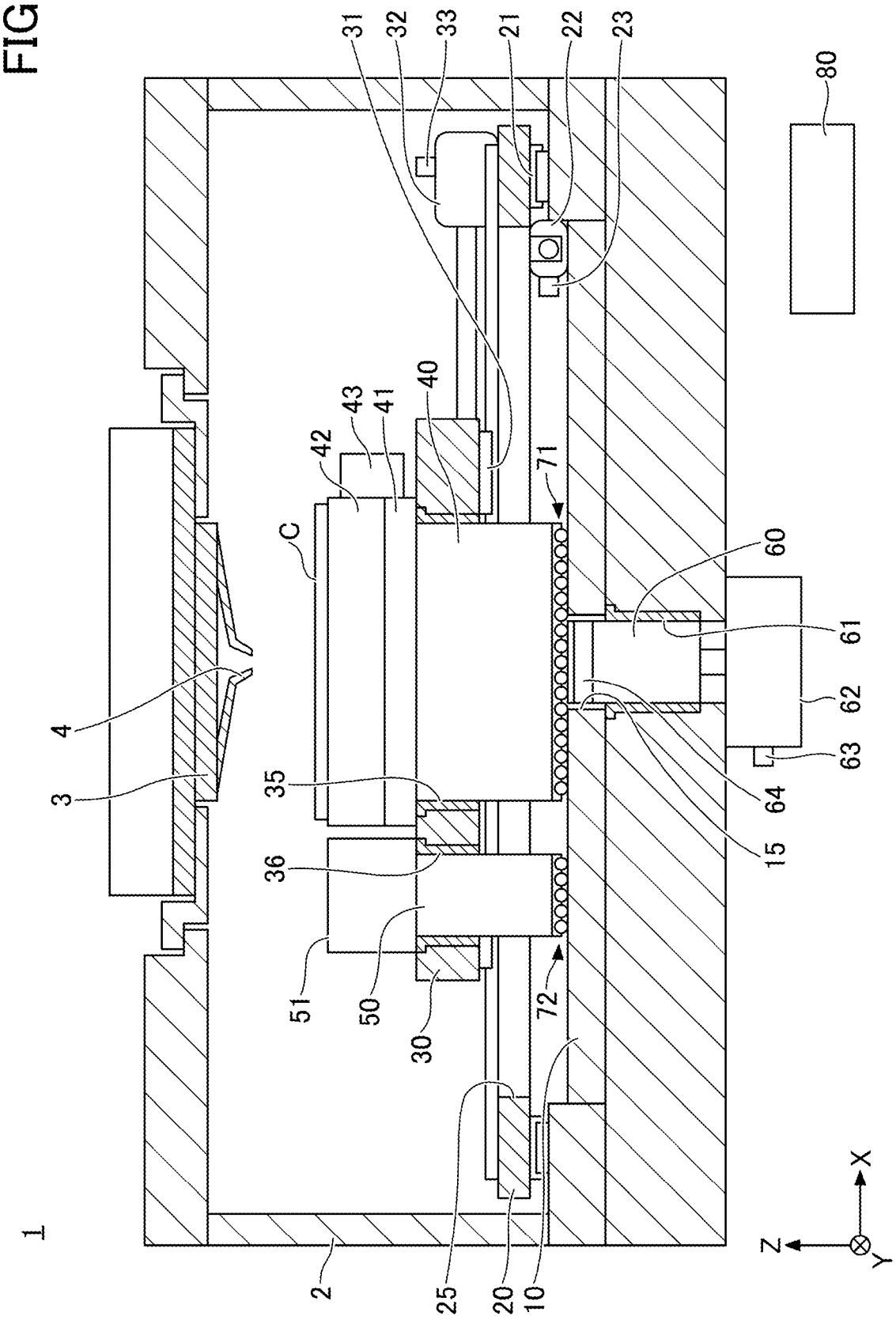
FIG. 1 is a schematic cross-sectional view illustrating a configuration of an inspection apparatus according to the first embodiment.

In the following, embodiments for carrying out the present disclosure will be described with reference to the drawings. In each drawing, the same components are indicated by the same reference numerals and overlapping descriptions may be omitted.

An inspection apparatus 1 according to a first embodiment will be described with reference to FIG. 1. FIG. 1 is a schematic cross-sectional view illustrating a configuration of the inspection apparatus 1 according to the first embodiment.

The inspection apparatus 1 is an apparatus that inspects the electrical characteristics for each of a plurality of electronic devices arranged on a carrier C (object to be inspected). It should be noted that the carrier C may include a wafer, a glass substrate, a chip alone, and the like.

The inspection apparatus 1 includes a probe chamber 2. A probe card 3 is arranged at the upper portion in the probe chamber 2. The probe card 3 includes a plurality of probes 4. A stage base 10 is provided with the lower portion of the probe chamber 2. A Y stage 20, a X stage 30, an upper Z stage 40, a θ stage 41, a chuck 42, a lower camera 43, a needle polishing plate support stage 50, and a needle polishing plate 51 are provided in the probe chamber 2.

The Y stage 20 moves the chuck 42 and the needle polishing plate 51 in the Y axis direction. The Y stage 20 is attached on a stage base 10 via a linear guide 21. The linear guide 21 may include, for example, a guide rail provided on the upper surface of the stage base 10 and extending in the Y axis direction, and a slider provided on the lower surface of the Y stage 20 and sliding along the guide rail. Thus, the Y stage 20 is configured to be movable in the Y direction.

A Y drive mechanism 22 drives the Y stage 20 in the Y direction. For example, the Y drive mechanism 22 may include a motor and a rotary linear motion mechanism (for example, a ball screw) that translates rotational motion of the motor into linear motion. The operation of the motor of the Y drive mechanism 22 is controlled by a controller 80.

A detector 23 detects the position of the Y stage 20 in the Y direction. In other words, the detector 23 detects the position of the chuck 42 and the needle polishing plate 51 in the Y direction. The detector 23 may be, for example, an encoder that detects the rotation of the motor of the Y drive mechanism 22, and a detection signal of the detector 23 is transmitted to the controller 80. The controller 80 calculates the position of the Y stage 20 in the Y direction based on the detection signal of the detector 23.

The Y stage 20 is formed in a frame shape and has an opening 25 penetrating in the Z axis direction.

The X stage 30 moves the chuck 42 and the needle polishing plate 51 in the X axis direction. The X stage 30 is attached on the Y stage 20 via a linear guide 31. The linear guide 31 may include, for example, a guide rail provided on the upper surface of the Y stage 20 and extending in the X axis direction, and a slider provided on the lower surface of the X stage 30 and sliding along the guide rail. Thus, the X stage 30 is configured to be movable in the X direction.

The X drive mechanism 32 drives the X stage 30 in the X direction. For example, the X drive mechanism may include a motor and a rotary linear motion mechanism (for example, a ball screw) that translates rotational motion of the motor into linear motion. The operation of the motor of the X drive mechanism 32 is controlled by the controller 80.

The detector 33 detects the position of the X stage 30 in the X direction. In other words, the detector 33 detects the position of the chuck 42 and the needle polishing plate 51 in the X direction. The detector 33 may be, for example, an encoder that detects the rotation of the motor of the X drive mechanism 32, and a detection signal of the detector 33 is transmitted to the controller 80. The controller 80 calculates the position of the X stage 30 in the X direction based on the detection signal of the detector 33.

The X stage 30 has two openings penetrating in the Z axis direction. The two openings are provided with respective guides 35 and 36.

The upper Z stage 40 is supported by the guide 35 such that the movement of the upper Z stage 40 in the X axis direction and the Y axis direction is restricted and the upper Z stage 40 is insertable and removable in the Z axis direction. Accordingly, the upper Z stage 40 is configured to be movable in the vertical direction with respect to the X stage 30.

The θ stage 41, the chuck 42, and the lower camera 43 are provided on the upper Z stage 40. The θ stage 41 has a function to rotate the chuck 42 with the Z axis as the rotation axis. A θ drive mechanism (not illustrated) that rotates the θ stage 41 is controlled by the controller 80. The chuck 42 carries a carrier C. The chuck 42 has a fixation mechanism (not illustrated) to fix the carrier C to the chuck 42. This prevents the positional deviation of the carrier C with respect to the chuck 42. A lower camera 43 is provided on the side surface of chuck 42. The lower camera 43 moves and rotates together with the chuck 42.

The needle polishing plate support stage 50 is supported by the guide 36 such that the movement of the needle polishing plate support stage 50 in the X axis direction and the Y axis direction is restricted and the needle polishing plate support stage 50 is insertable and removable in the Z axis direction. Thus, the needle polishing plate support stage 50 is configured to be movable in the vertical direction with respect to the X stage 30.

The needle polishing plate 51 is provided on the needle polishing plate support stage 50. The needle polishing plate 51 contacts the tips of the probes 4 to polish the tips of the probes 4.

The stage base 10 has an opening 15 that penetrates in the Z axis direction. A guide 61 is provided in the opening 15.

The lower Z stage 60 is supported by the guide 61 such that the movement of the lower Z stage 60 in the X axis direction and the Y axis direction is restricted and the lower Z stage 60 is insertable and removable in the Z axis direction. Thus, the lower Z stage 60 is configured to be movable in the vertical direction with respect to the stage base 10.

The Z drive mechanism 62 drives the lower Z stage 60 in the Z direction. For example, the Z drive mechanism 62 may include a motor and a rotary linear motion mechanism (for example, a ball screw) that translates rotational motion of the motor into linear motion. The operation of the motor of the Z drive mechanism 62 is controlled by the controller 80.

Here, when causing the probes 4 to be in contact with the carrier C mounted on the chuck 42 or the needle polishing plate 51, the axis passing through the position of the center of gravity of the press load of the probe card 3 and the axis passing through the position of the center of gravity of the press load of the lower Z stage 60 are arranged so as to keep on the same axis (see FIGS. 5, 7, 9, and 11, which will be described later below). In other words, the axis passing through the point of action of the pushing force when the lower Z stage 60 pushes up the upper Z stage 40 and the axis passing through the point of action of the load received by the probe card 3 are arranged at positions to be common. Here, axes to be common means that they are on the same axis (the axes match) and that they substantially match (in the same direction). For example, the central axis of the probe card 3 and the central axis of the lower Z stage 60 are common. In addition, the central axis of the probe card 3 and the central axis of the ball screw of the Z drive mechanism 62 are common.

The detector 63 detects the position of the lower Z stage 60 in the Z direction. In other words, the detector 63 detects the position in the Z axis direction of the needle polishing plate 51 coupled to the needle polishing plate support stage 50 or the chuck 42 provided on the upper Z stage 40 coupled to the lower Z stage 60. For example, the detector 63 may be an encoder that detects the rotation of the motor of the Z drive mechanism 62, and a detection signal of the detector 63 is transmitted to the controller 80. The controller 80 calculates the position of the lower Z stage 60 in the Z direction based on the detection signal of the detector 63.

The load cell 64 detects a load received by the lower Z stage 60. A detection signal of the load cell 64 is input to the controller 80. It should be noted that a torque sensor that detects the torque of the Z drive mechanism 62 may be used instead of the load cell 62. Also, in a case of feedback controlling the detected load, the controller 80 performs position control and load control at the same time.

The lower portion of the upper Z stage 40 is provided with a movable coupling mechanism 71. The movable coupling mechanism 71 is configured to be switchable between a coupling state in which the upper Z stage 40 and the lower Z stage 60 are coupled and a movable state in which the coupling of the upper Z stage 40 and the lower Z stage 60 is released and the upper Z stage 40 is movable on the stage base 10.

The lower portion of the needle polishing plate support stage 50 is provided with a movable coupling mechanism 72. The movable coupling mechanism 72 is configured to switch between a coupling state in which the needle polishing plate support stage 50 and the lower Z stage 60 are coupled and a movable state in which the coupling of the needle polishing plate support stage 50 and the lower Z stage 60 is released and the needle polishing plate support stage 50 is movable on the stage base 10.

Figure 2:
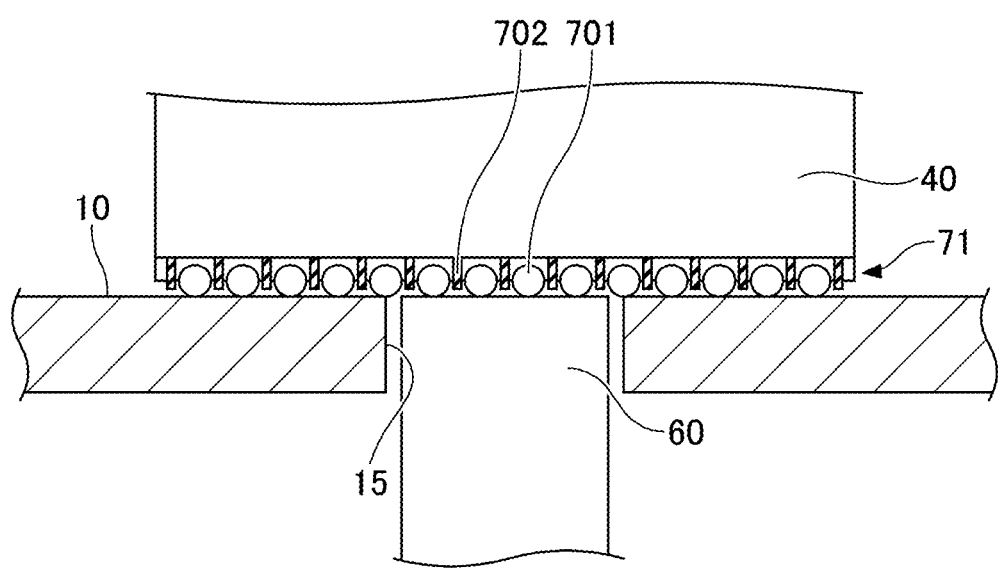
FIG. 2 is a schematic diagram illustrating a movable coupling mechanism.

FIG. 2 is a schematic diagram illustrating the movable coupling mechanism 71. The movable coupling mechanism 71 includes a horizontal movement mechanism 701 and a coupling mechanism 702.

The horizontal movement mechanism 701 makes the upper Z stage 40 movable on the stage base 10. As the horizontal movement mechanism 701, for example, a free bearing, an air bearing, or a ball type air bearing that is movable in the planar direction may be used.

The coupling mechanism 702 couples the upper Z stage 40 and the lower Z stage 60 to be connectable and detachable. For example, an electromagnet may be used as the coupling mechanism 702. The coupling mechanism 702 is controlled by the controller 80.

Returning to FIG. 1, the controller 80 controls the operation of the inspection apparatus 1. The controller 80 receives detection signals input from the detectors 23, 33, and 63 and the load cell 64. The controller 80 controls the Y drive mechanism 22, the X drive mechanism 32, the Z drive mechanism 62, the θ drive mechanism, and the movable coupling mechanisms 71 and 72.

Figure 3:
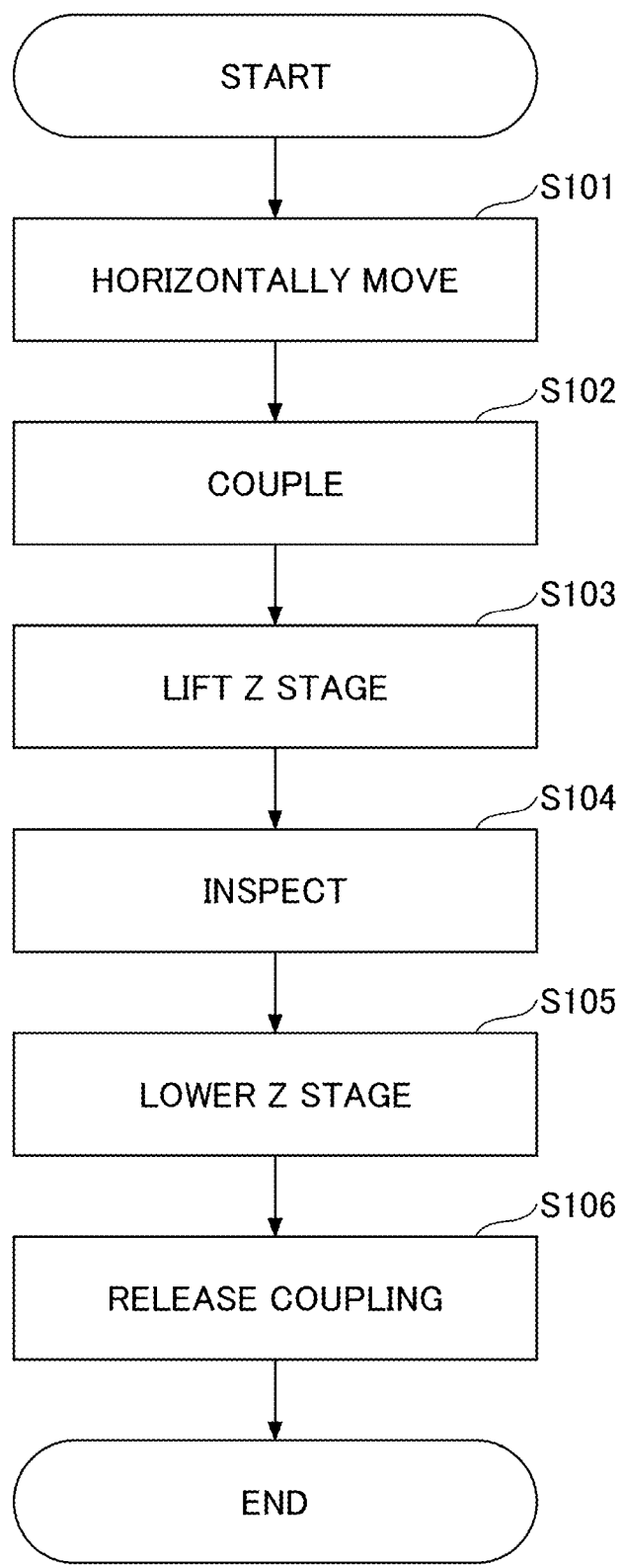
FIG. 3 is a flowchart illustrating an example of an operation of the inspection apparatus according to the first embodiment.

Next, an operation of the inspection apparatus 1 according to the first embodiment will be described with reference to FIG. 3. FIG. 3 is a flowchart illustrating an example of the operation of the inspection apparatus 1 according to the first embodiment.

In step S101, the controller 80 controls the Y drive mechanism 22 and the X drive mechanism 32 to move the chuck 42 (the needle polishing plate 51) to a predetermined position.

In step S102, the controller 80 controls the movable coupling mechanism 71 (72) to be in the coupling state. Thus, the upper Z stage 40 (the needle polishing plate support stage 50) and the lower Z stage 60 are coupled.

In step S103, the controller 80 controls the Z drive mechanism 62 to lift the lower Z stage 60. This causes the probes 4 to contact an electrode of an electronic device arranged on the carrier C. The controller 80 detects, by the load cell 64, the load at the time of contact and controls the Z drive mechanism 62 to control the contact load. Thereby, a tester (not illustrated) is connected to the electronic device via the probes 4.

In step S104, the controller 80 controls the tester to inspect the electrical characteristics of the electronic device.

In step S105, the controller 80 controls the Z drive mechanism 62 to lower the lower Z stage 60.

In step S106, the controller 80 controls the movable coupling mechanism 71 (72) to release the coupling. Thereby, the coupling of the upper Z stage 40 (the needle polishing plate support stage 50) and the lower Z stage 60 is released. Also, the upper Z stage 40 (the needle polishing plate support stage 50) becomes in a state of being moveable in the horizontal direction.

Step S101 to Step S106 are repeated for each electronic device.

Next, the stress in each state of the inspection apparatus 1 according to the first embodiment will be described with reference to FIG. 4 to FIG. 11.

Figure 4:
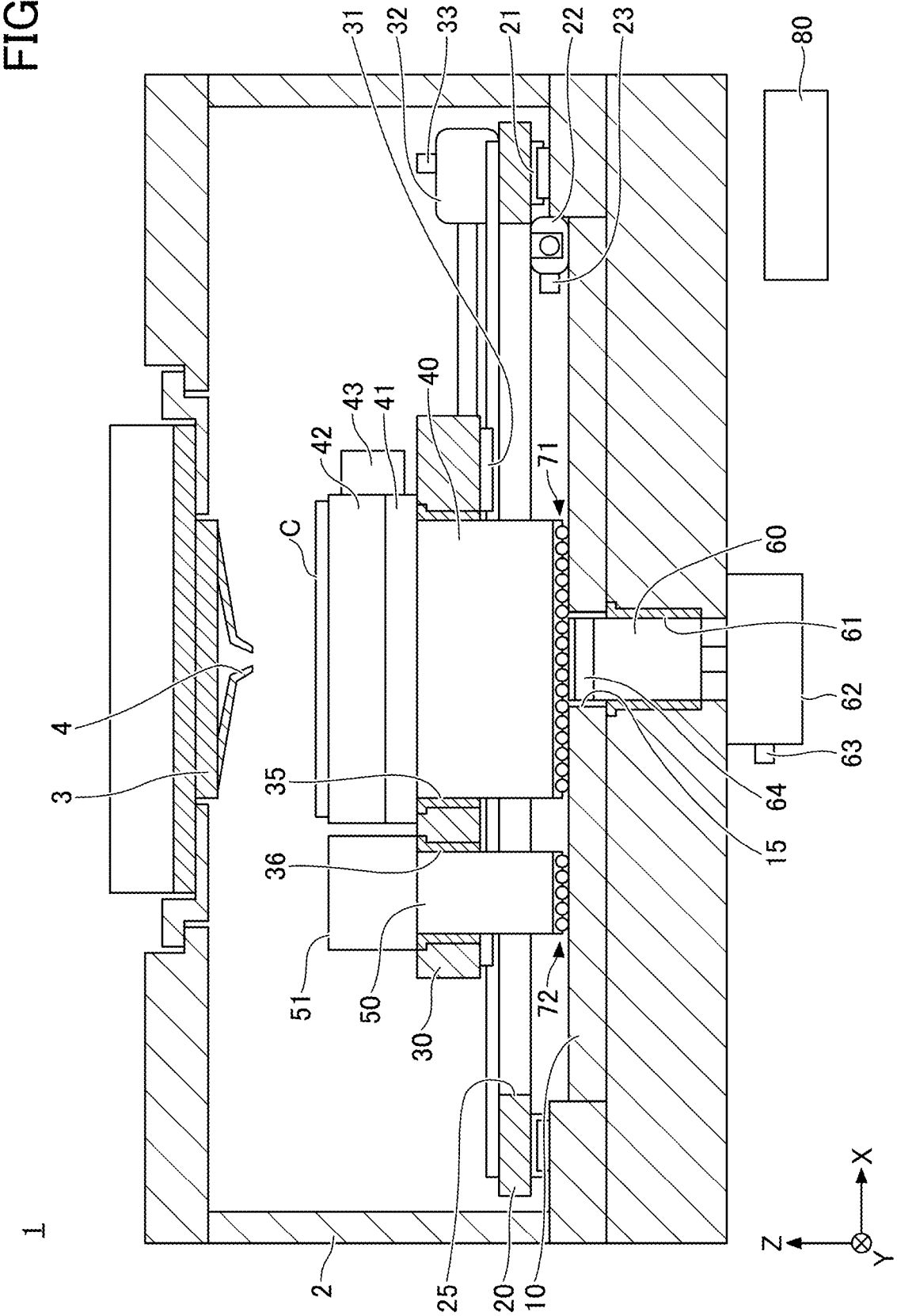
FIG. 4 is a schematic cross-sectional view after horizontal movement when an electronic device at the center of the carrier in the inspection apparatus according to the first embodiment is inspected.
Figure 5:
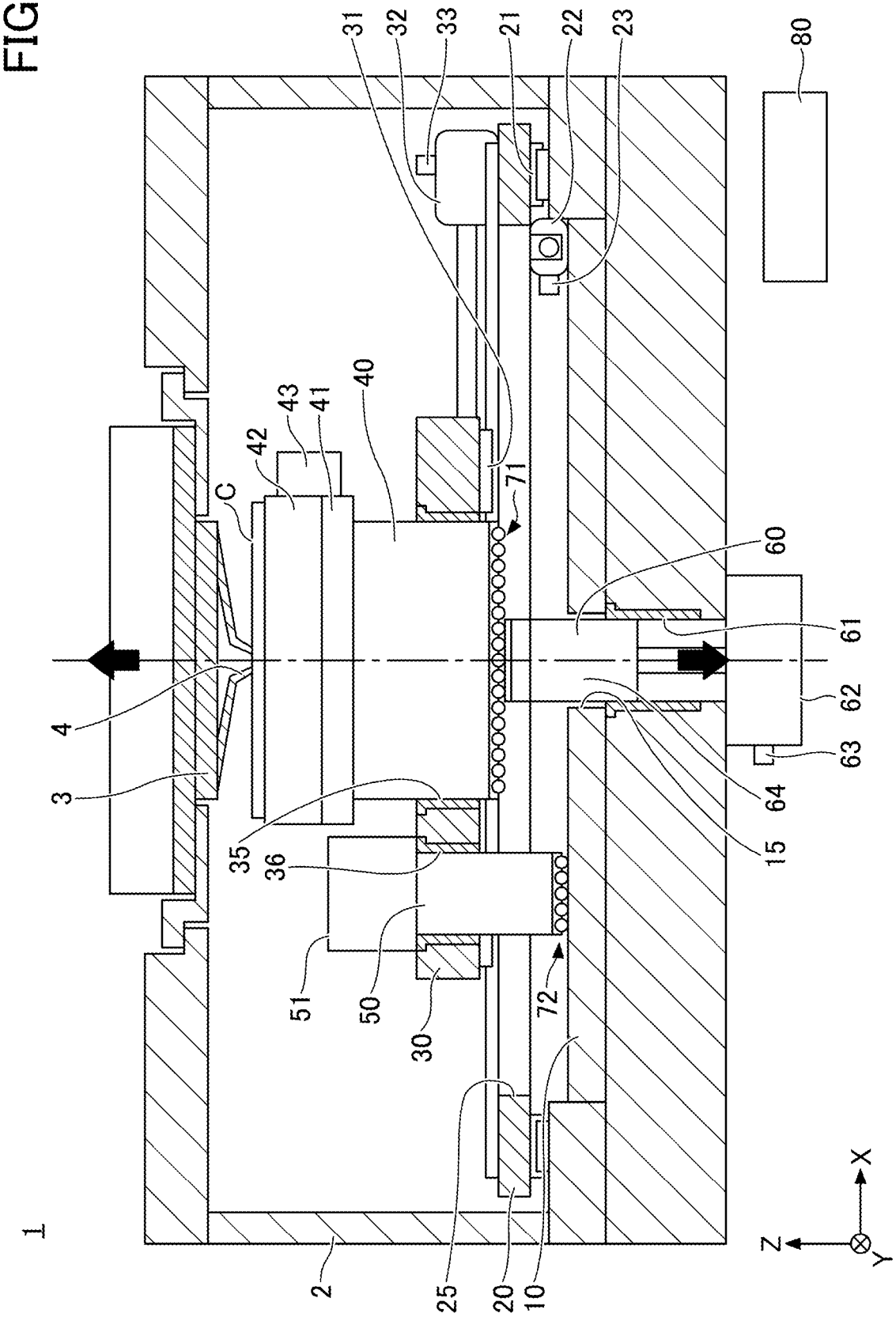
FIG. 5 is a schematic cross-sectional view at the time of inspecting the electronic device at the center of the carrier in the inspection apparatus according to the first embodiment.

FIG. 4 is a schematic cross-sectional view after horizontal movement when an electronic device at the center of the carrier C in the inspection apparatus 1 according to the first embodiment is inspected. FIG. 5 is a schematic cross-sectional view at the time of inspecting the electronic device at the center of the carrier C in the inspection apparatus 1 according to the first embodiment.

As illustrated in FIG. 4, the Y stage 20 and the X stage 30 are moved to arrange the electronic device at the center of the carrier C below the probes 4. Next, the movable coupling mechanism 72 is caused to be in the coupling state to couple the upper Z stage 40 and the lower Z stage 60. As illustrated in FIG. 5, the Z drive mechanism 62 is driven to lift the chuck 42 and press the probes 4 against the carrier C. At this time, the reaction force received by the probe card 3 and the reaction force received by the Z drive mechanism 62 are indicated by the black arrows. Because the axis passing through the position of the center of gravity of the press load of the probe card 3 and the axis passing through the position of the center of gravity of the press load of the Z drive mechanism 62 are arranged on the same axis, the upper Z stage 40 can be prevented from tilting.

Figure 6:
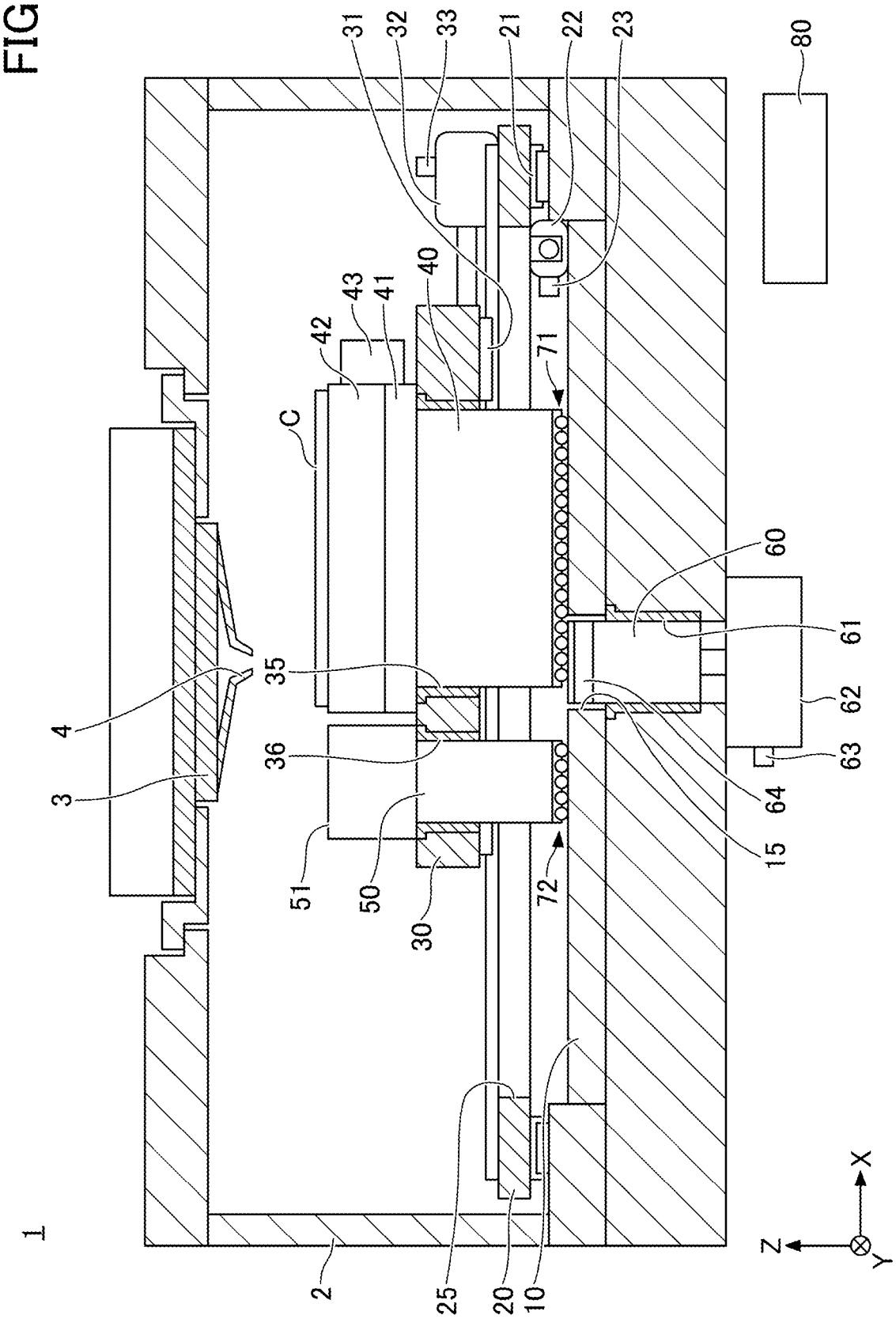
FIG. 6 is a schematic cross-sectional view after horizontal movement when an electronic device at the outer periphery of the carrier in the inspection apparatus according to the first embodiment is inspected.
Figure 7:
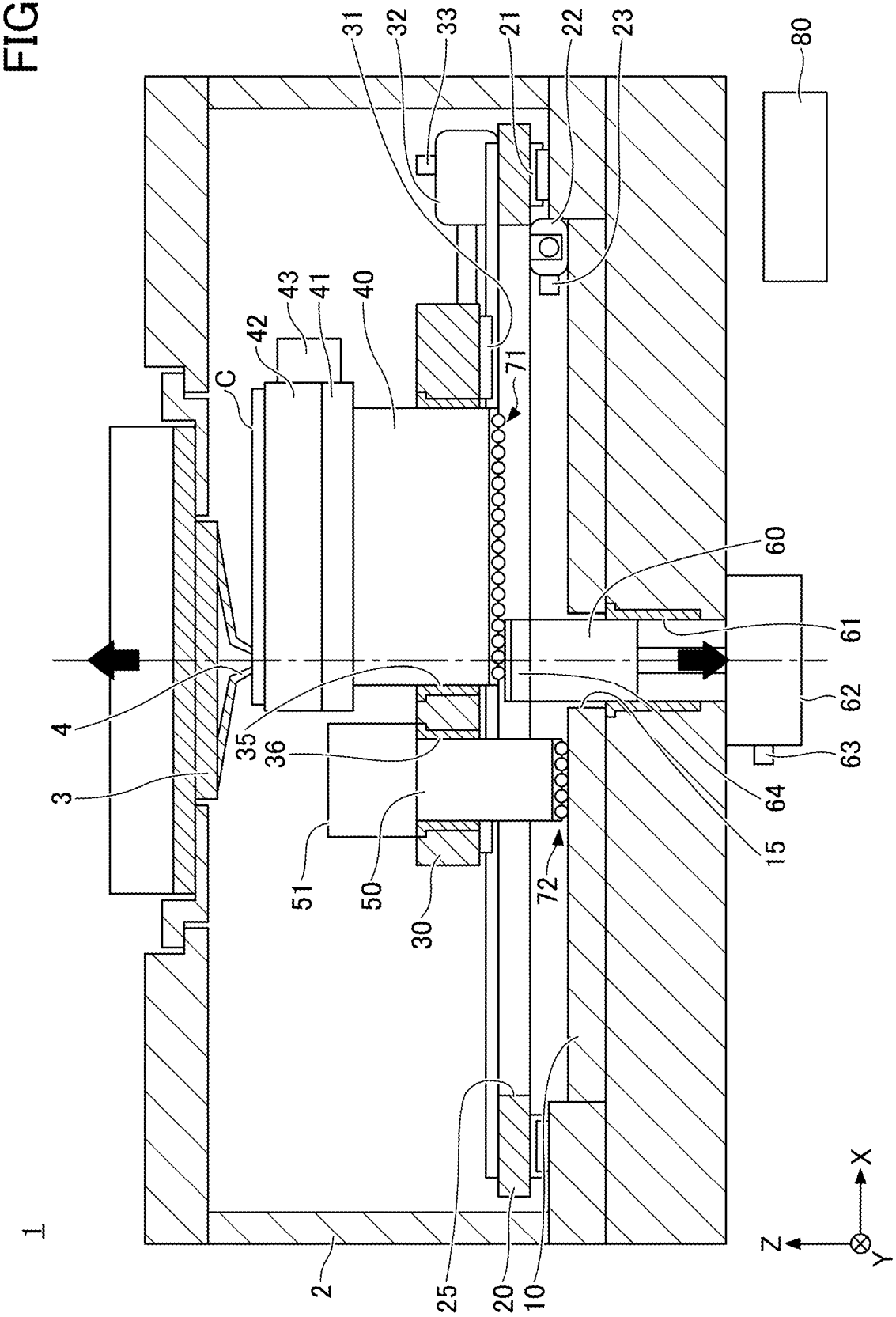
FIG. 7 is a schematic cross-sectional view at the time of inspecting the electronic device at the outer periphery of the carrier in the inspection apparatus according to the first embodiment.

FIG. 6 is a schematic cross-sectional view after horizontal movement when an electronic device at the outer periphery of the carrier C in the inspection apparatus 1 according to the first embodiment is inspected. FIG. 7 is a schematic cross-sectional view at the time of inspecting the electronic device at the outer periphery of the carrier C in the inspection apparatus 1 according to the first embodiment.

As illustrated in FIG. 6, the Y stage 20 and X stage 30 are moved to arrange the electronic device at the outer periphery of the carrier C below the probes 4. Next, the movable coupling mechanism 72 is caused to be in the coupling state to couple the upper Z stage 40 and the lower Z stage 60. As illustrated in FIG. 7, the Z drive mechanism 62 is driven to lift the chuck 42 and press the probes 4 against the carrier C. At this time, the reaction force received by the probe card 3 and the reaction force received by the Z drive mechanism 62 are indicated by the black arrows. Because the axis passing through the position of the center of gravity of the press load of the probe card 3 and the axis passing through the position of the center of gravity of the press load of the Z drive mechanism 62 are arranged on the same axis, the upper Z stage 40 can be prevented from tilting.

Figure 8:
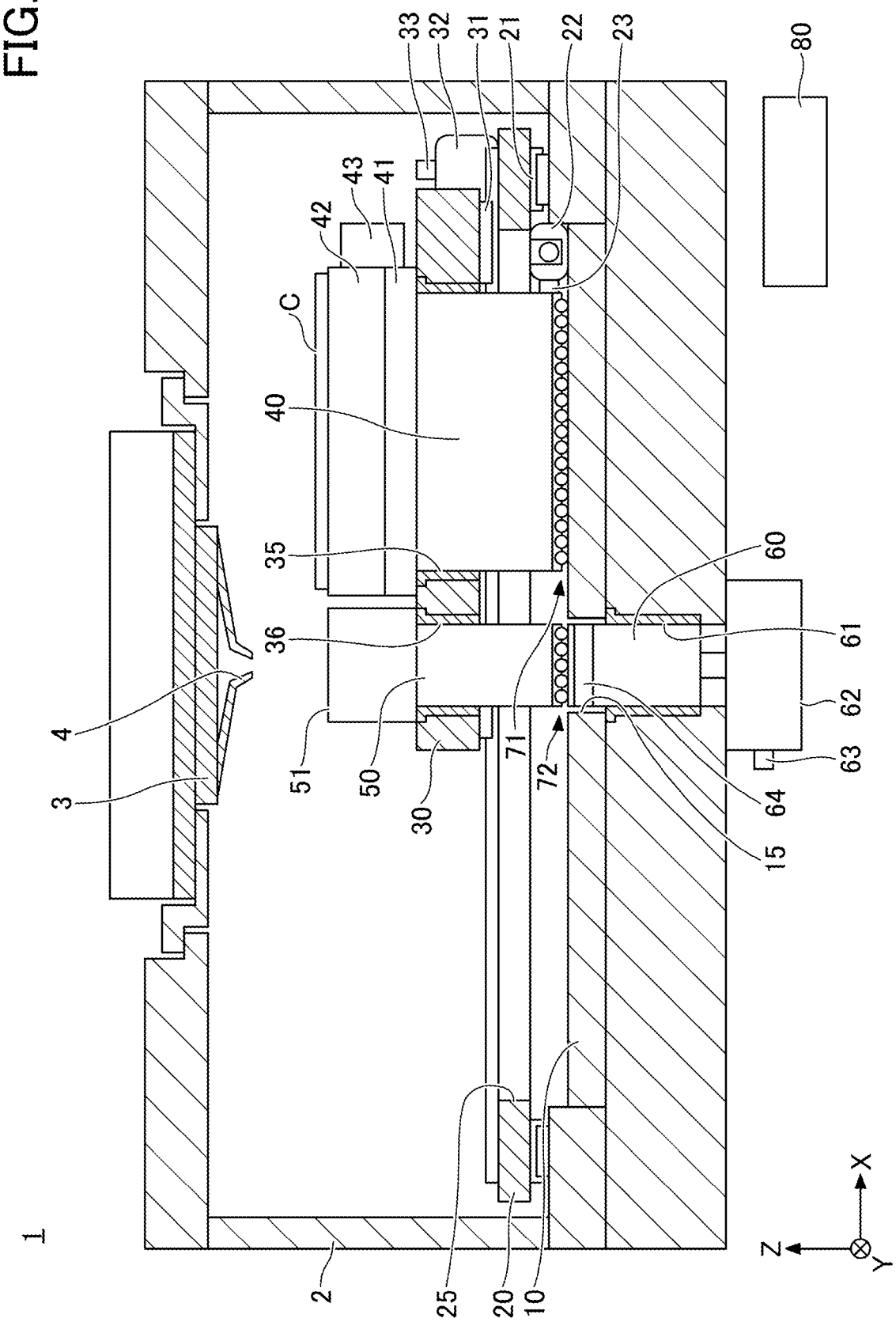
FIG. 8 is a schematic cross-sectional view after horizontal movement when casing the probes to be in contact with the center of the needle polishing plate in the inspection apparatus according to the first embodiment.
Figure 9:
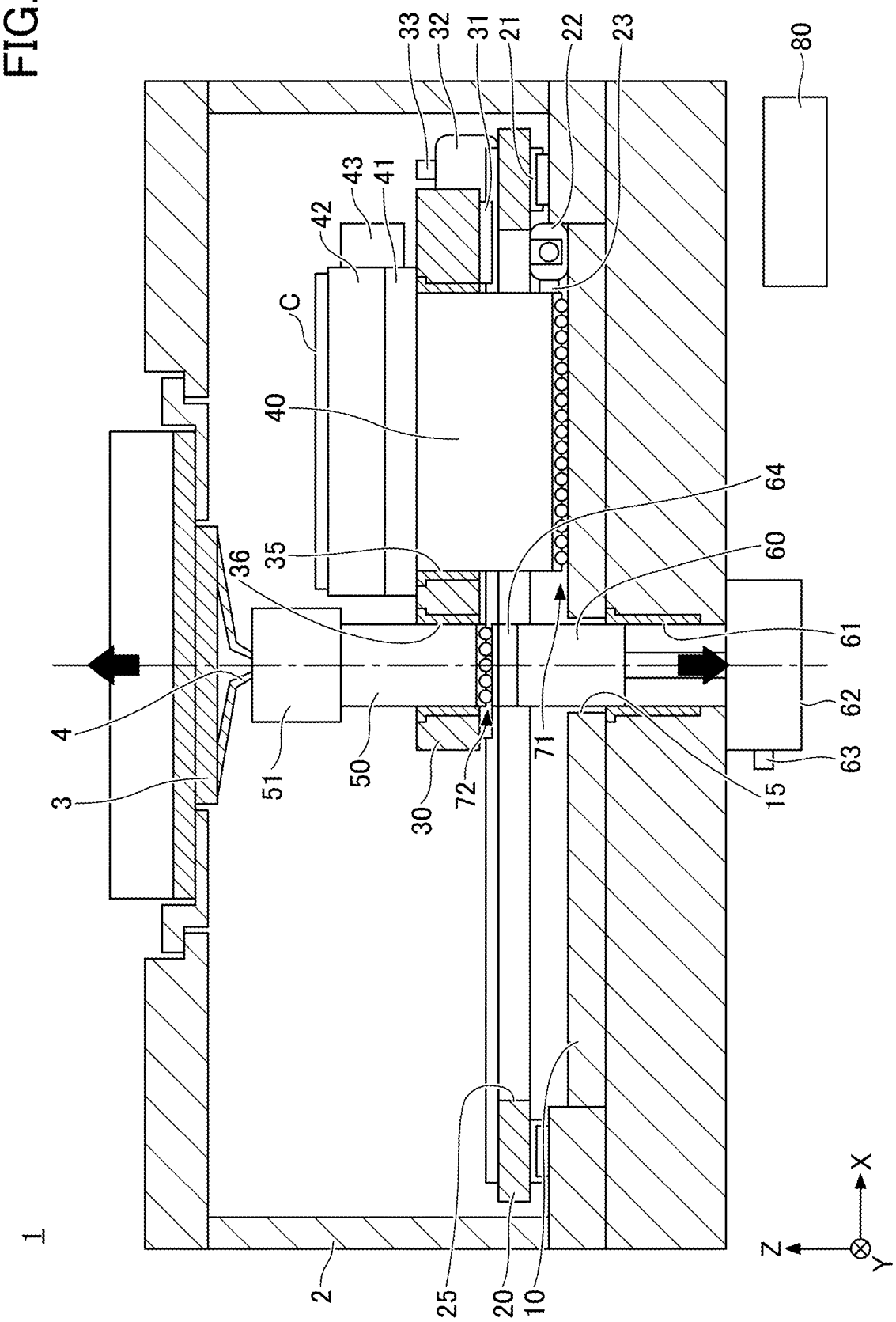
FIG. 9 is a schematic cross-sectional view when casing the probes to be in contact with the center of the needle polishing plate in the inspection apparatus according to the first embodiment.

FIG. 8 is a schematic cross-sectional view after horizontal movement when casing the probes 4 to be in contact with the center of the needle polishing plate 51 in the inspection apparatus 1 according to the first embodiment. FIG. 9 is a schematic cross-sectional view when casing the probes 4 to be in contact with the center of the needle polishing plate 51 in the inspection apparatus 1 according to the first embodiment.

As illustrated in FIG. 8, the Y stage 20 and the X stage 30 are moved to arrange the center of the needle polishing plate 51 below the probes 4. Next, the movable coupling mechanism 72 is caused to be in the coupling state to couple the needle polishing plate support stage 50 and the lower Z stage 60. As illustrated in FIG. 9, the Z drive mechanism 62 is driven to lift the needle polishing plate 51 and press the probes 4 against the needle polishing plate 51. At this time, the reaction force received by the probe card 3 and the reaction force received by the Z drive mechanism 62 are indicated by the black arrows. Because the axis passing through the position of the center of gravity of the press load of the probe card 3 and the axis passing through the position of the center of gravity of the press load of the Z drive mechanism 62 are arranged on the same axis, the needle polishing plate support stage 50 can be prevented from tilting.

Figure 10:
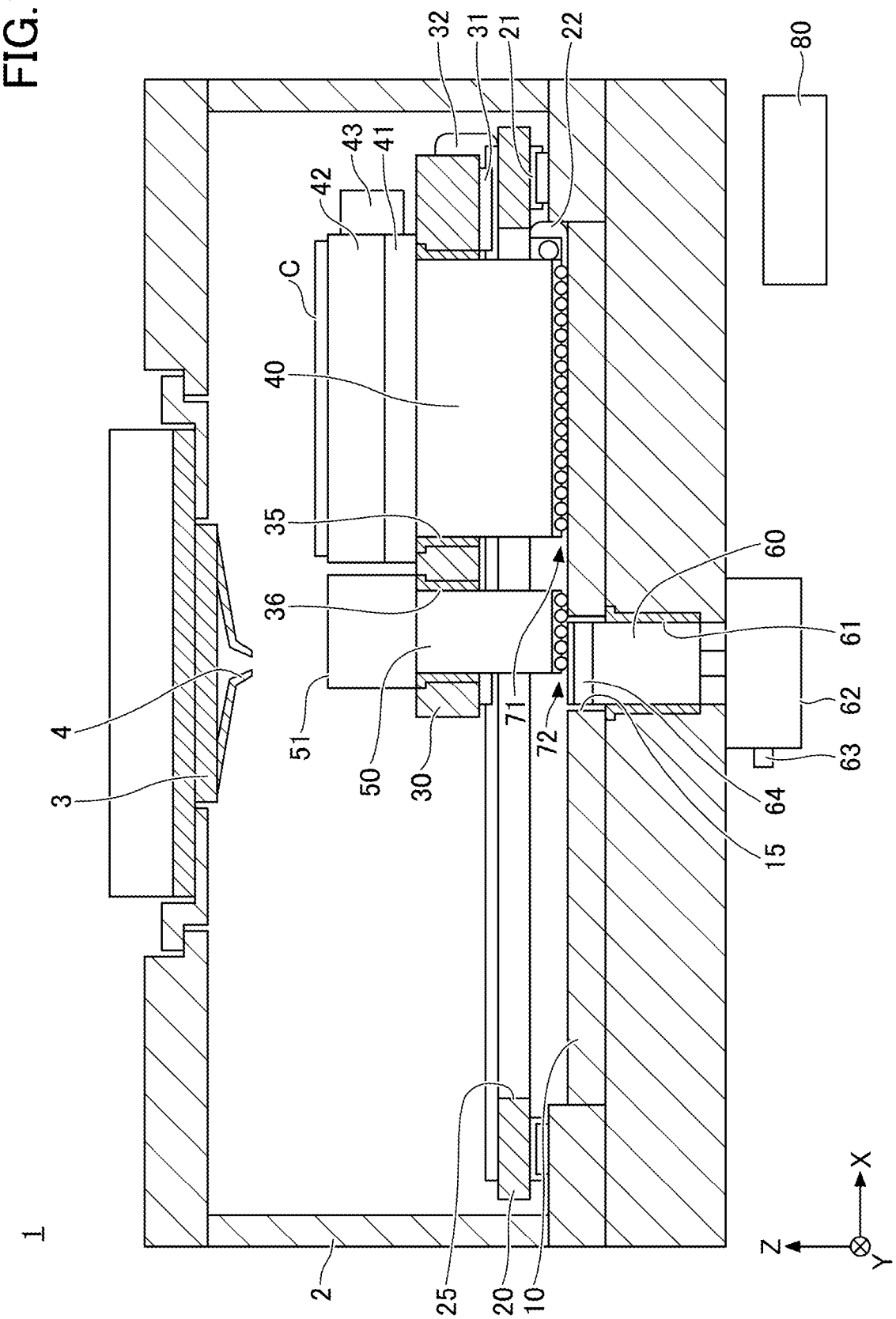
FIG. 10 is a schematic cross-sectional view after horizontal movement when causing the probes to be in contact with the outer periphery of the needle polishing plate in the inspection apparatus according to the first embodiment.
Figure 11:
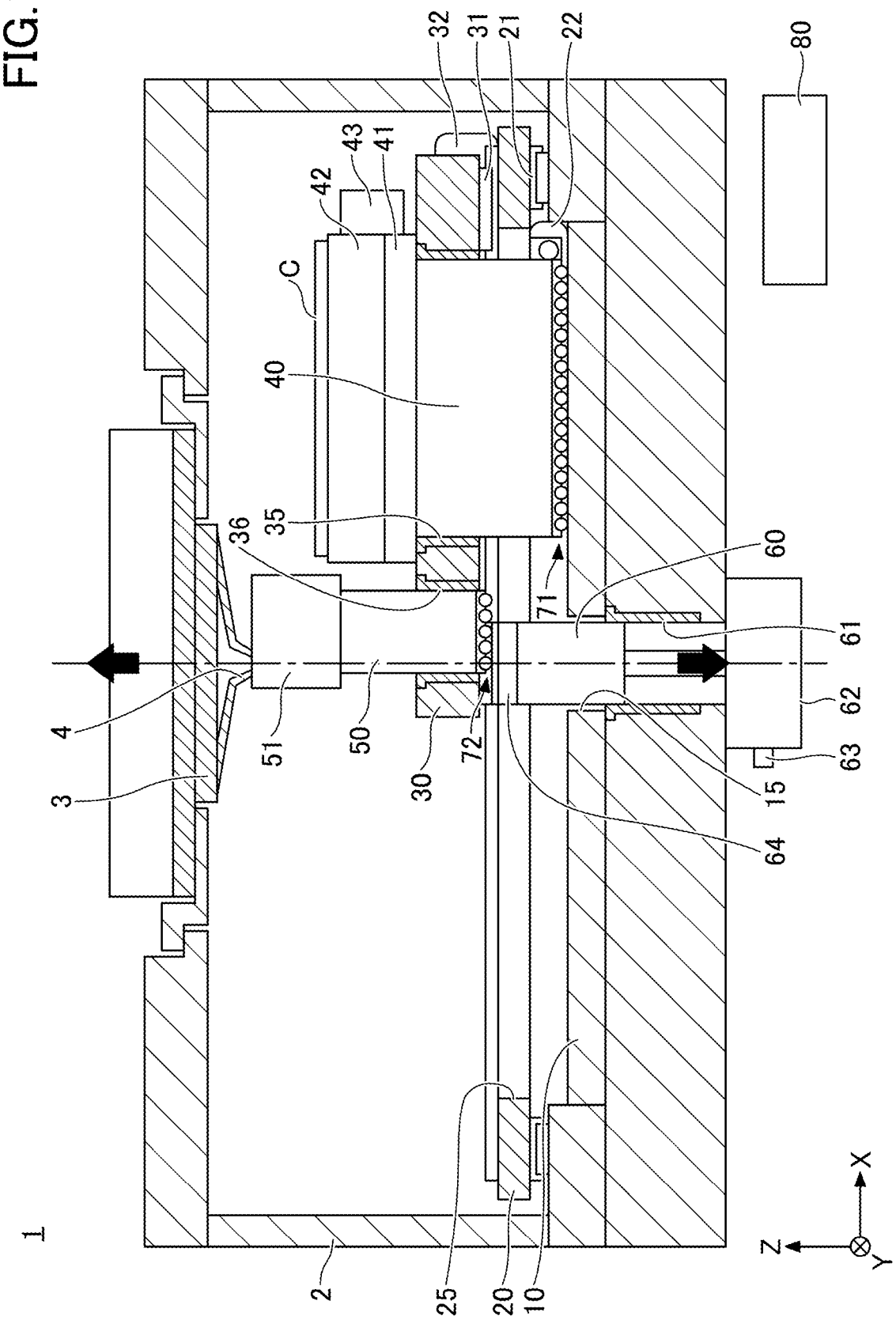
FIG. 11 is a schematic cross-sectional view when causing the probes to be in contact with the outer periphery of the needle polishing plate in the inspection apparatus according to the first embodiment.

FIG. 10 is a schematic cross-sectional view after horizontal movement when causing the probes 4 to be in contact with the outer periphery of the needle polishing plate 51 in the inspection apparatus 1 according to the first embodiment. FIG. 11 is a schematic cross-sectional view when causing the probes 4 to be in contact with the outer periphery of the needle polishing plate 51 in the inspection apparatus 1 according to the first embodiment.

As illustrated in FIG. 10, the Y stage 20 and the X stage 30 are moved to arrange the outer periphery of the needle polishing plate 51 below the probes 4. Next, the movable coupling mechanism 72 is caused to be in the coupling state to couple the needle polishing plate support stage 50 and the lower Z stage 60. As illustrated in FIG. 11, the Z drive mechanism 62 is driven to lift the needle polishing plate 51 and press the probes 4 against the needle polishing plate 51. At this time, the reaction force received by the probe card 3 and the reaction force received by the Z drive mechanism 62 are indicated by the black arrows. Because the axis passing through the position of the center of gravity of the press load of the probe card 3 and the axis passing through the position of the center of gravity of the press load of the Z drive mechanism 62 are arranged on the same axis, the needle polishing plate support stage 50 can be prevented from tilting.

Figure 12:
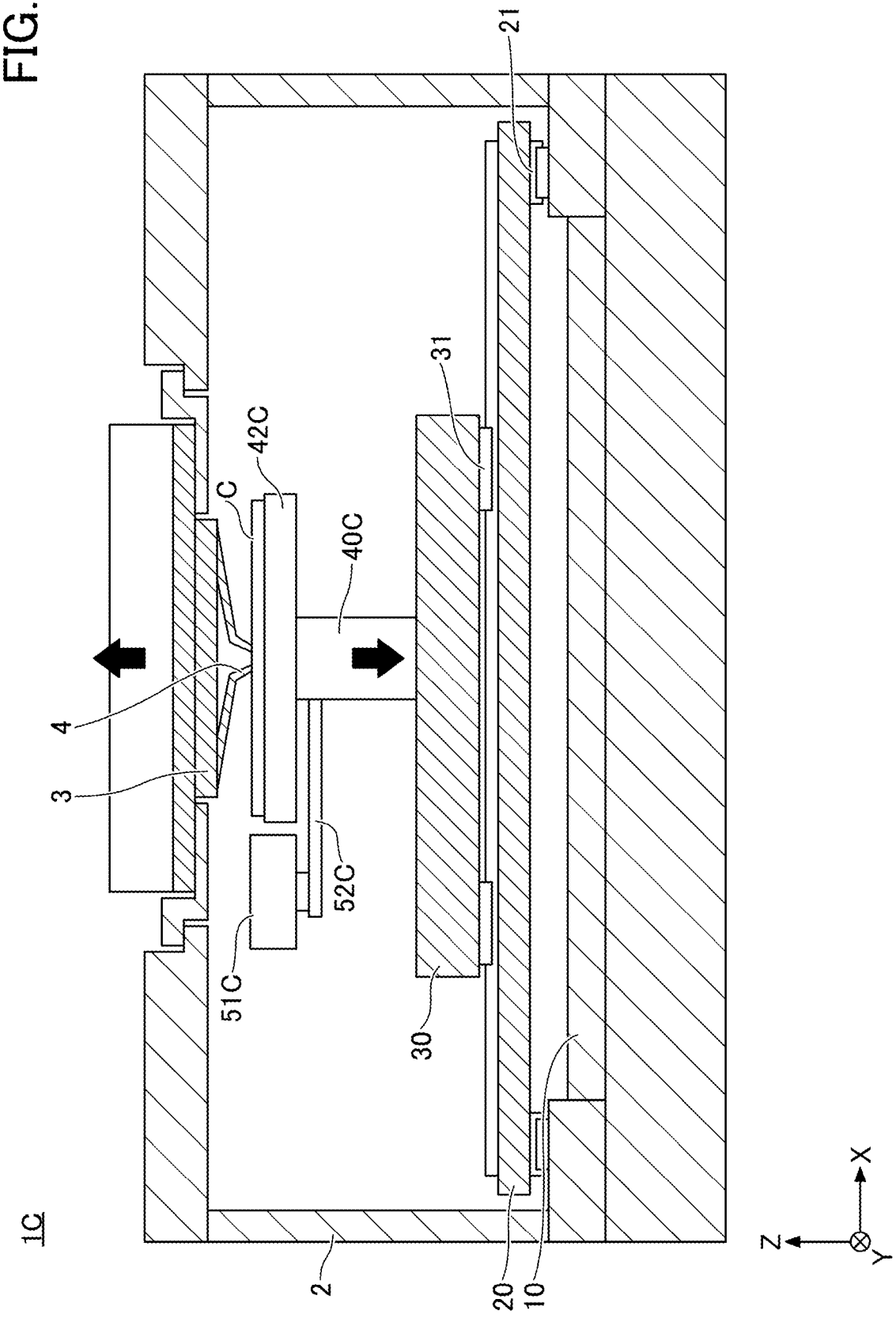
FIG. 12 is a schematic cross-sectional view at the time of inspecting an electronic device at the center of the carrier in an inspection apparatus according to a reference example.
Figure 13:
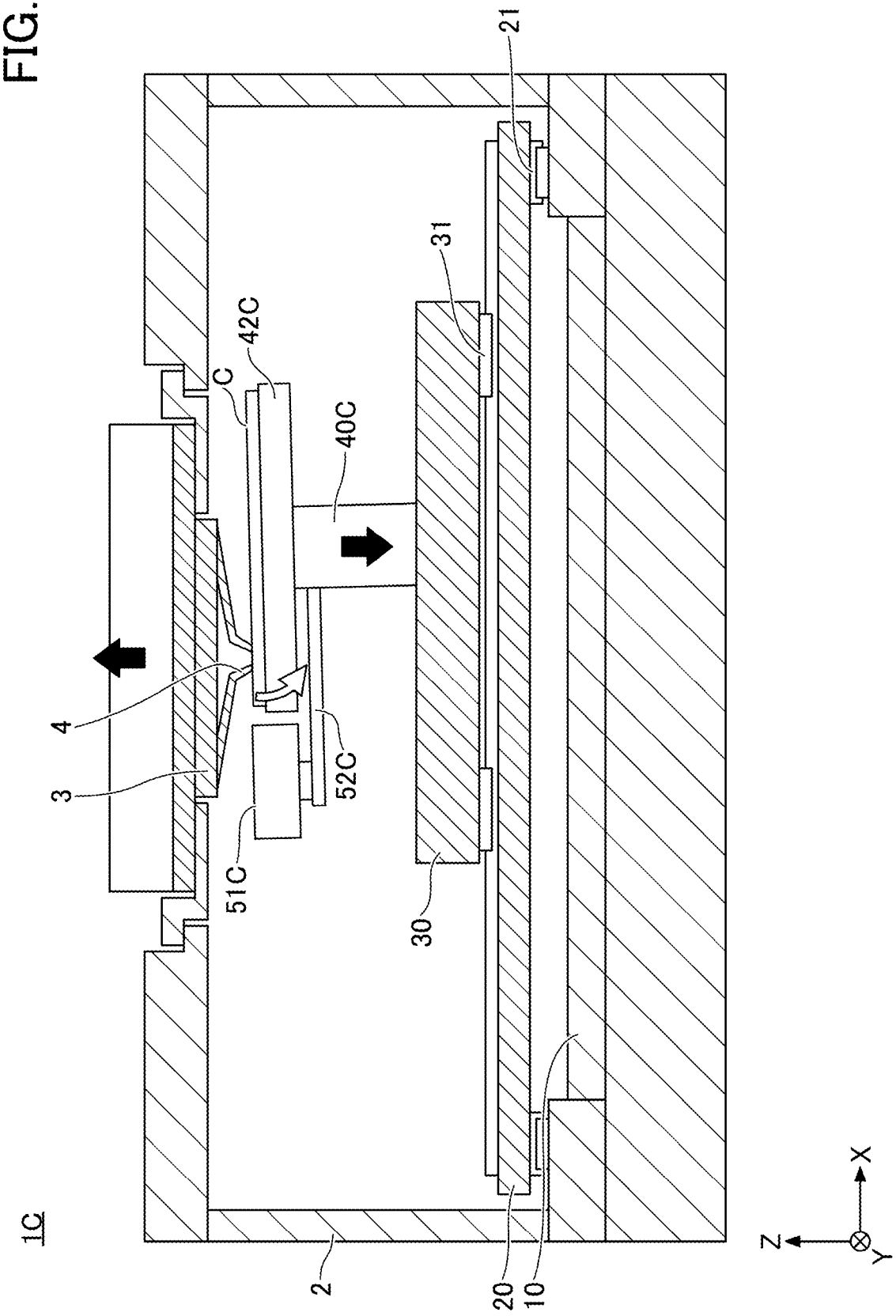
FIG. 13 is a schematic cross-sectional view at the time of inspecting an electronic device at the outer periphery of the carrier in the inspection apparatus according to the reference example.
Figure 14:
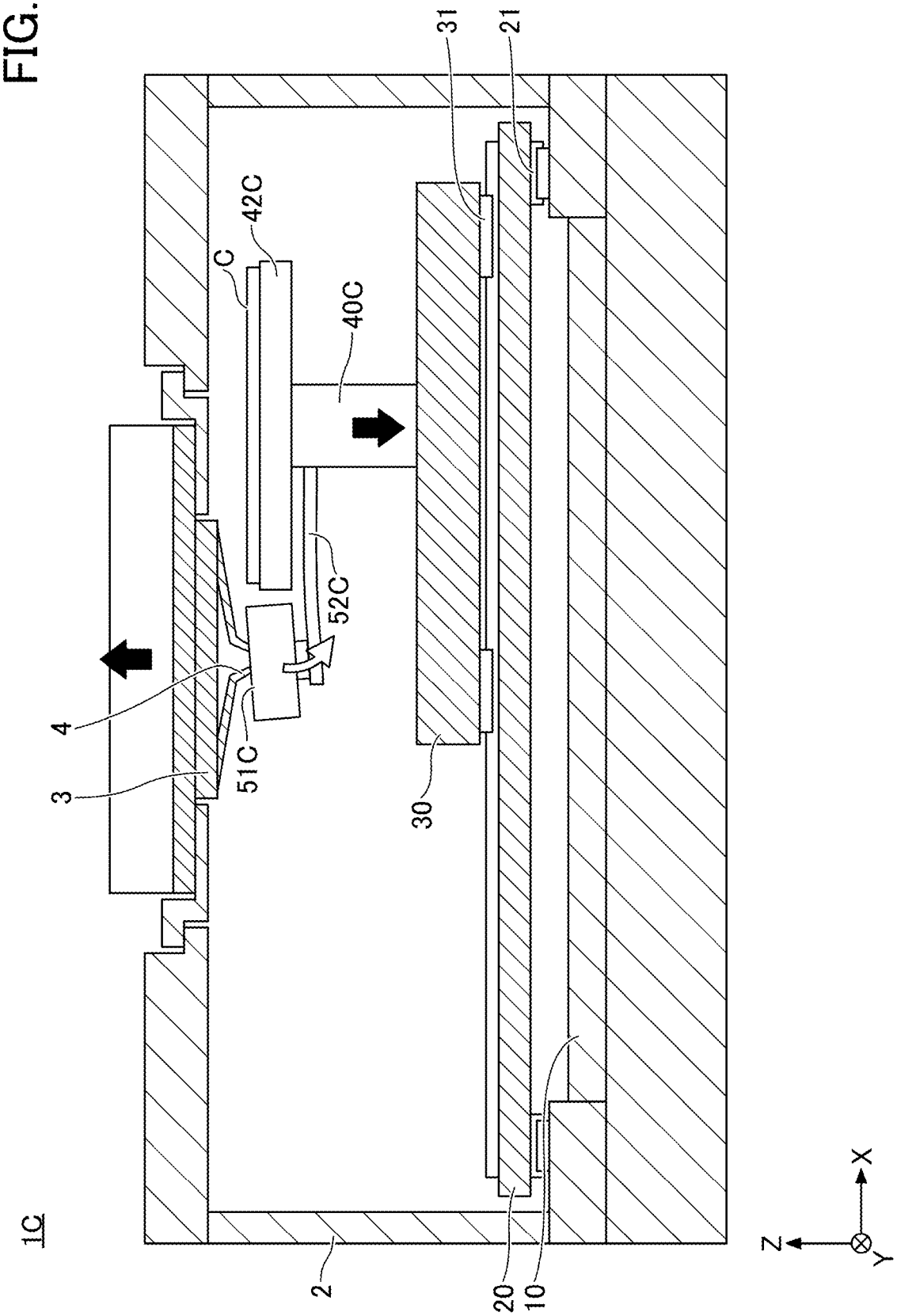
FIG. 14 is a schematic cross-sectional view when causing the probes to be in contact with the center of the needle polishing plate in the inspection apparatus according to the reference example.
Figure 15:
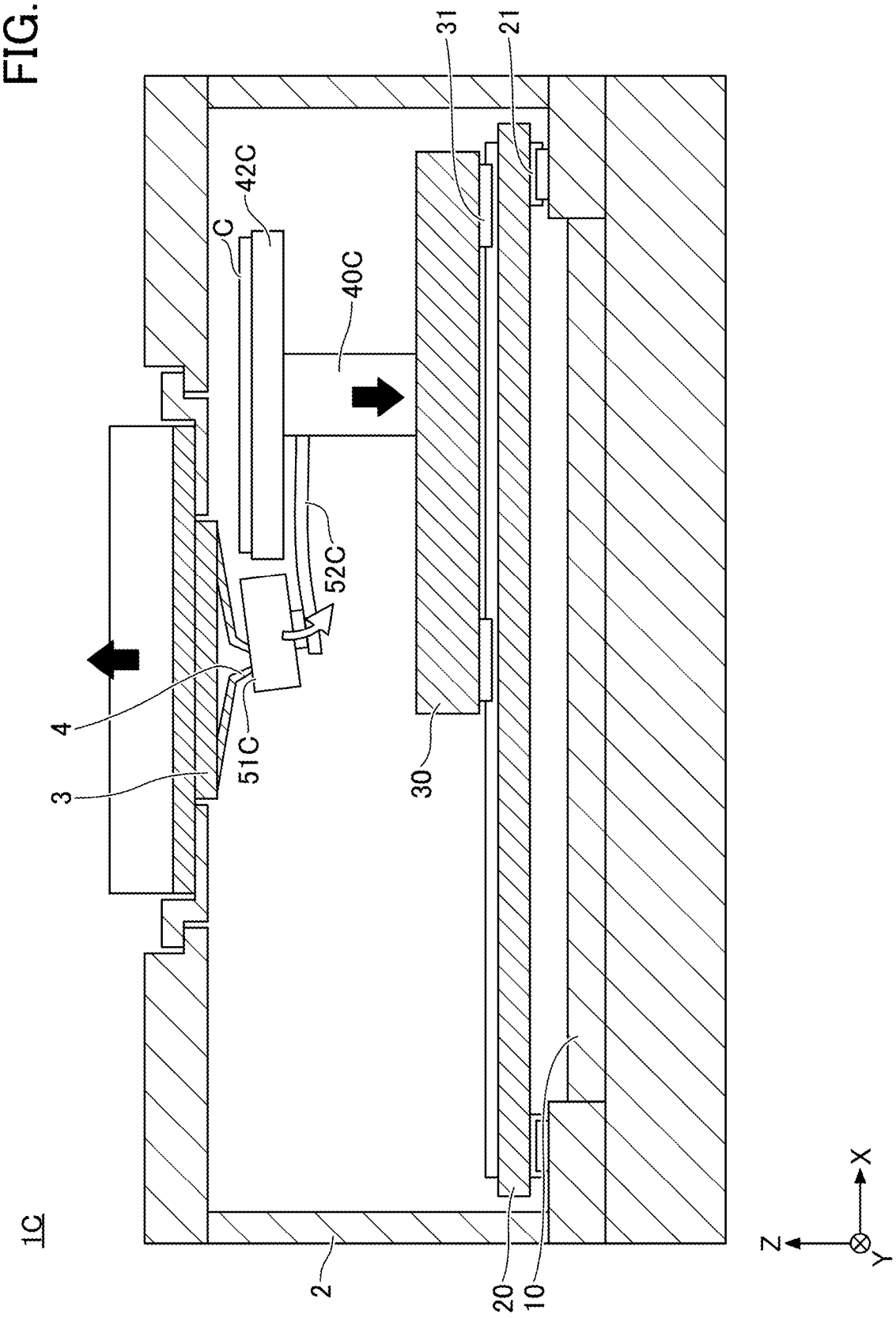
FIG. 15 is a schematic cross-sectional view when causing the probes to be in contact with the outer periphery of the needle polishing plate in the inspection apparatus according to the reference example.

Here, an example of an inspection apparatus 1C according to a reference example will be described. FIG. 12 is a schematic cross-sectional view at the time of inspecting an electronic device at the center of the carrier C in the inspection apparatus 10 according to the reference example. FIG. 13 is a schematic cross-sectional view at the time of inspecting an electronic device at the outer periphery of the carrier C in the inspection apparatus 1C according to the reference example. FIG. 14 is a schematic cross-sectional view when causing the probes 4 to be in contact with the center of the needle polishing plate 510 in the inspection apparatus 10 according to the reference example. FIG. 15 is a schematic cross-sectional view when causing the probes 4 to be in contact with the outer periphery of the needle polishing plate 51C in the inspection apparatus 10 according to the reference example. At this time, the reaction force received by the probe card 3 and the reaction force received by the Z drive mechanism 62 are indicated by the black arrows.

In the inspection apparatus 10 according to the reference example, a Z drive mechanism (not illustrated) is provided on the X stage 30, and a Z stage 40C is lifted/lowered with respect to the X stage 30. Also, the needle polishing plate 51C is fixed to the Z stage 40C through a beam structure 52C.

As illustrated in FIG. 12, when an electronic device at the center of the carrier C is inspected, the reaction force received by the probe card 3 and the reaction force received by the Z drive mechanism are arranged on the same axis. Therefore, the Z stage 40C can be prevented from tilting.

On the other hand, as illustrated in FIG. 13, when an electronic device at the outer periphery of the carrier C is inspected, the reaction force received by the probe card 3 and the reaction force received by the Z drive mechanism are arranged on different axes.

Also, as illustrated in FIG. 14, when causing the probes 4 to be in contact with the center of the needle polishing plate 51C, the reaction force received by the probe card 3 and the reaction force received by the Z drive mechanism are arranged on different axes. Therefore, as indicated by the white arrow, the beam structure 52C is bent, and the needle polishing plate 51C is tilted.

Also, as illustrated in FIG. 15, when causing the probes 4 to be in contact with the outer periphery of the needle polishing plate 51C, the reaction force received by the probe card 3 and the reaction force received by the Z drive mechanism are arranged on different axes. Therefore, as indicated by the white arrow, the beam structure 52C is further bent, and the needle polishing plate 51C is further tilted.

As described above, according to the inspection apparatus 1 according to the first embodiment, not only in a case of causing the probes 4 to be in contact with the center of the carrier C, but also in a case of causing the probes 4 to be in contact with the outer periphery of the carrier C, the axis passing through the position of the center of gravity of the press load of the probe card 3 and the axis passing through the position of the center of gravity of the press load of (the lower Z stage 60) the Z drive mechanism 62 can be kept on the same axis at any time (see FIG. 5 and FIG. 7). Thereby, even when the contact load is increased, the upper Z stage 40 can be prevented from falling down.

Further, according to the inspection apparatus 1 according to the first embodiment, it is possible to prevent the needle polishing plate 51 from falling down (see FIG. 9 and FIG. 11). Further, because the upper Z stage 40 and the needle polishing plate support stage 50 can be lifted and lowered by a single Z drive mechanism 62, the cost of the inspection apparatus 1 can be reduced without individually providing drive mechanisms.

Figure 16:
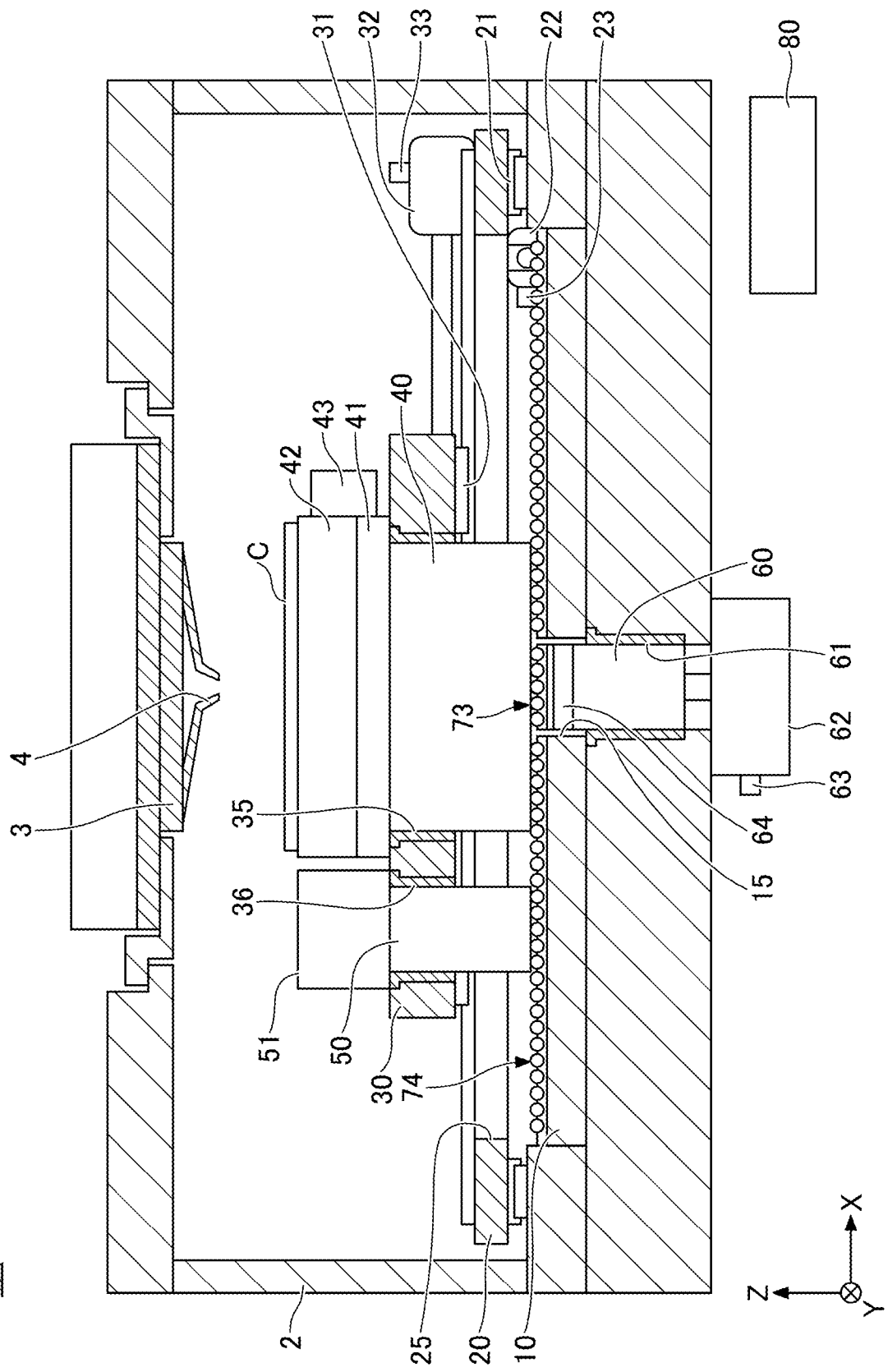
FIG. 16 is a schematic cross-sectional view after horizontal movement when an electronic device at the center of the carrier of an inspection apparatus according to a second embodiment is inspected.
Figure 17:
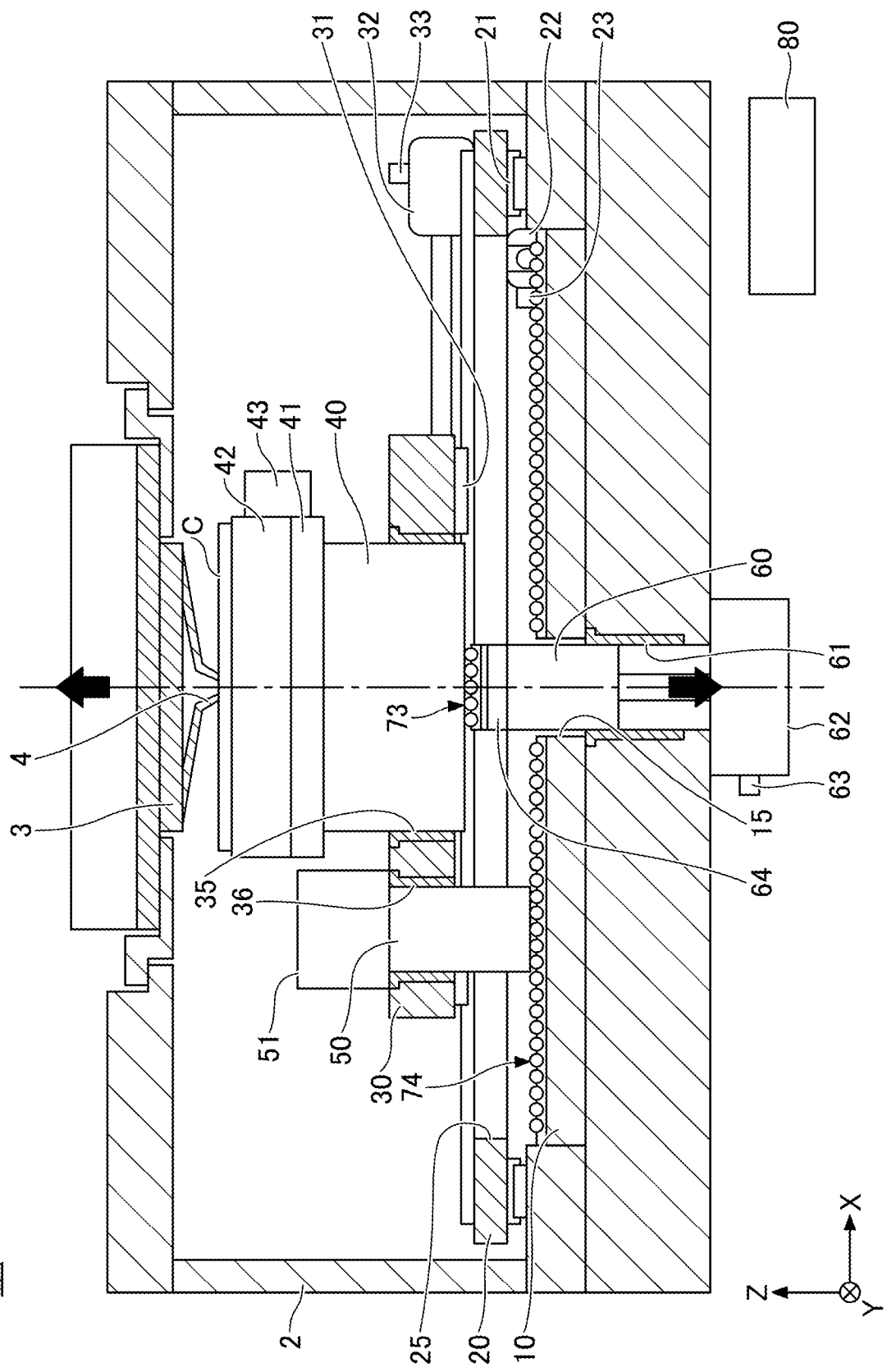
FIG. 17 is a schematic cross-sectional view at the time of inspecting an electronic device at the center of the carrier in the inspection apparatus according to the second embodiment.

Next, an inspection apparatus 1A according to a second embodiment will be described with reference to FIG. 16 and FIG. 17. FIG. 16 is a schematic cross-sectional view after horizontal movement when an electronic device at the center of the carrier C of the inspection apparatus 1A according to the second embodiment is inspected. FIG. 17 is a schematic cross-sectional view at the time of inspecting an electronic device at the center of the carrier C in the inspection apparatus 1A according to the second embodiment.

The inspection apparatus 1A according to the second embodiment includes a movable coupling mechanism 73 and a movable mechanism 74 in place of the movable coupling mechanisms 71 and 72 in comparison with the inspection apparatus 1 according to the first embodiment. The other configurations of the second embodiment are similar to those of the first embodiment and overlapping descriptions may be omitted.

The upper portion of the upper Z stage 60 is provided with a movable coupling mechanism 73. The movable coupling mechanism 73 is configured to be switchable between a coupling state in which the upper Z stage 40 or the needle polishing plate support stage 50 and the lower Z stage 60 are coupled and a movable state in which the coupling of the upper Z stage 40 or the needle polishing plate support stage 50 and the lower Z stage 60 is released and the upper Z stage 40 or the needle polishing plate support stage 50 is movable on the lower Z stage 60. The movable coupling mechanism 73 includes a horizontal movement mechanism and a coupling mechanism. The horizontal movement mechanism makes the upper Z stage 40 or the needle polishing plate support stage 50 movable on the lower Z stage 60. As the horizontal movement mechanism, for example, a free bearing, an air bearing, or a ball type air bearing that is movable in the planar direction may be used. The coupling mechanism couples the upper Z stage 40 or the needle grinding plate support stage 50 and the lower Z stage 60 to be connectable and detachable. For example, an electromagnet may be used as the coupling mechanism. The coupling mechanism is controlled by the controller 80.

The upper portion of the stage base 10 is provided with a movable mechanism 74. The movable mechanism 74 includes a horizontal movement mechanism. The horizontal movement mechanism makes the upper Z stage 40 or the needle polishing plate support stage 50 movable on the stage base 10. As the horizontal movement mechanism, for example, a free bearing, an air bearing, or a ball type air bearing that is movable in the planar direction may be used.

As described above, according to the inspection apparatus 1A according to the second embodiment, similarly to the inspection apparatus 1 according to the first embodiment, the axis passing through the position of the center of gravity of the press load of the probe card 3 and the axis passing through the position of the center of gravity of the press load of (the lower Z stage 60) the Z drive mechanism 62 can be kept on the same axis at any time. Thereby, even when the contact load is increased, the upper Z stage 40 can be prevented from falling down. The needle polishing plate 51 can also be prevented from falling down. Further, because the upper Z stage 40 and the needle polishing plate support stage 50 can be lifted and lowered by a single Z drive mechanism 62, the cost of the inspection apparatus 1 can be reduced without individually providing drive mechanisms.

Figure 18:
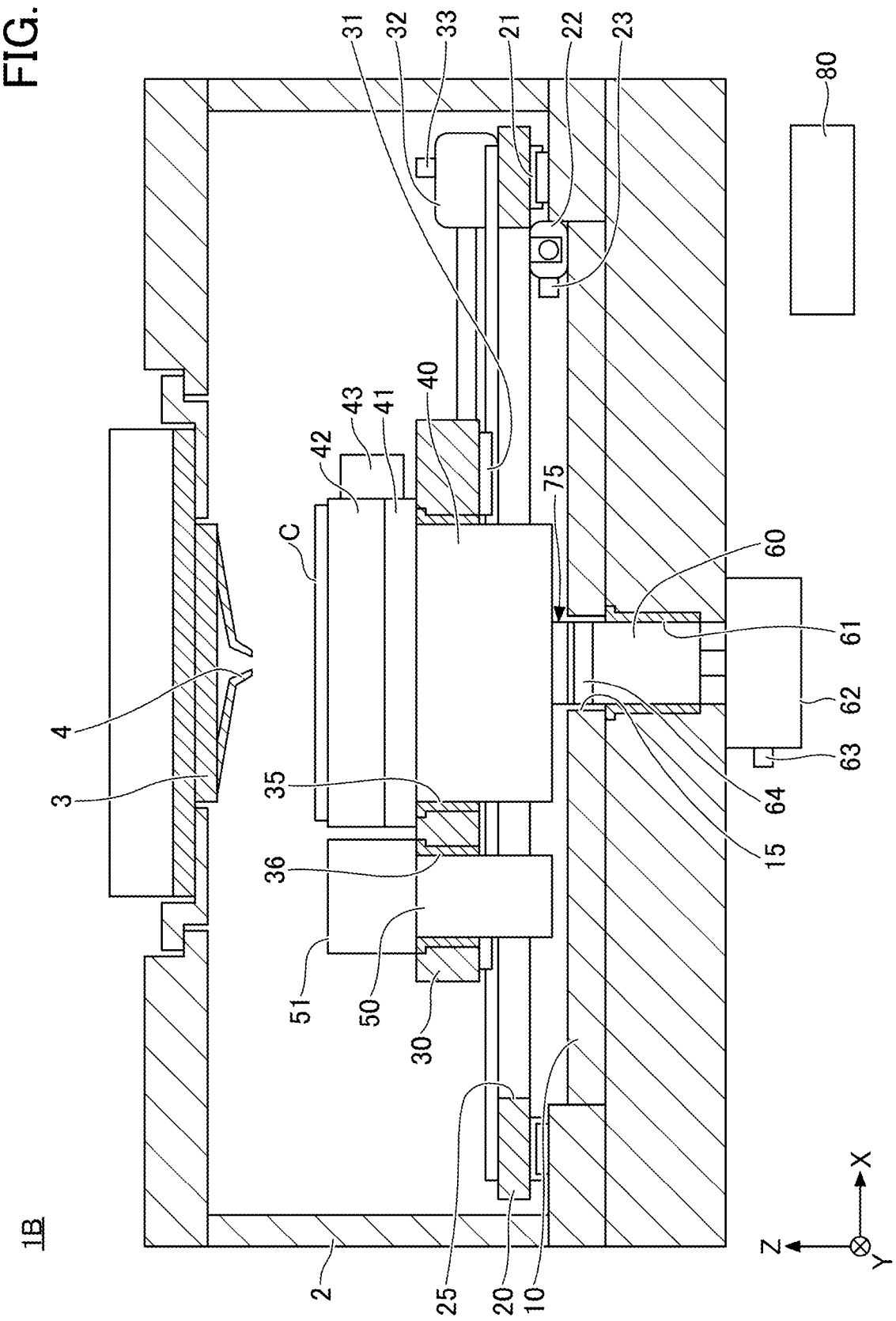
FIG. 18 is a schematic cross-sectional view illustrating a configuration of an inspection apparatus according to a third embodiment.

Next, an inspection apparatus 1B according to a third embodiment will be described with reference to FIG. 18. FIG. 18 is a schematic cross-sectional view illustrating a configuration of the inspection apparatus 1B according to the third embodiment.

The inspection apparatus 1B according to the third embodiment includes a movable coupling mechanism 75 in place of the movable coupling mechanisms 71 and 72 in comparison with to the inspection apparatus 1 according to the first embodiment. The other configurations of the third embodiment are similar to those described above and overlapping descriptions may be omitted. Also, the upper Z stage 40 and the needle polishing plate support stage 50 are configured to be suspended by the X stage 30 when lowered. Accordingly, the upper Z stage 40 and the needle polishing plate support stage 50 are configured to be non-contact with the stage base 10. The other configurations of the third embodiment are similar to those described above and overlapping descriptions may be omitted.

The upper portion of the upper Z stage 60 is provided with a movable coupling mechanism 75. The movable coupling mechanism 75 is configured to be switchable between a coupling state in which the upper Z stage 40 or the needle polishing plate support stage 50 and the lower Z stage 60 are coupled and a movable state in which the coupling of the upper Z stage 40 or the needle polishing plate support stage 50 and the lower Z stage 60 is released and the upper Z stage 40 or the needle polishing plate support stage 50 is movable on the lower Z stage 60. The movable coupling mechanism 75 includes an O-ring provided on the upper surface of the lower Z stage 60 and an intake and exhaust mechanism for intake and exhaust of a space surrounded by an O-ring. The intake and exhaust mechanism couples the upper Z stage 40 or the needle polishing plate support stage 50 and the lower Z stage 60 by vacuum suction by taking in air from the space surrounded by the O ring. Also, the intake and exhaust mechanism releases the coupling of the upper Z stage 40 or the needle polishing plate support stage 50 and the lower Z stage 60 by supplying air into the space surrounded by the O ring. Also, the supplied air causes the upper Z stage 40 or the needle polishing plate support stage 50 to float from the lower Z stage 60. Thereby, the upper Z stage 40 and the needle polishing plate support stage 50 can move in the horizontal direction.

The O ring can also be used as a cushion to absorb impact when the upper Z stage 40 or the needle polishing plate support stage 50 and the lower Z stage 60 come into contact. Thereby, it is possible to suppress the impact at the time of coupling the upper Z stage 40 or the needle polishing plate support stage 50 and the lower Z stage 60.

As described above, according to the inspection apparatus 1B according to the third embodiment, similarly to the inspection apparatus 1 according to the first embodiment, the axis passing through the position of the center of gravity of the press load of the probe card 3 and the axis passing through the position of the center of gravity of the press load of (the lower Z stage 60) the Z drive mechanism 62 can be kept on the same axis at any time. Thereby, even when the contact load is increased, the upper Z stage 40 can be prevented from falling down. The needle polishing plate 51 can also be prevented from falling down. Further, because the upper Z stage 40 and the needle polishing plate support stage 50 can be lifted and lowered by a single Z drive mechanism 62, the cost of the inspection apparatus 1 can be reduced without individually providing drive mechanisms.

Figure 19:
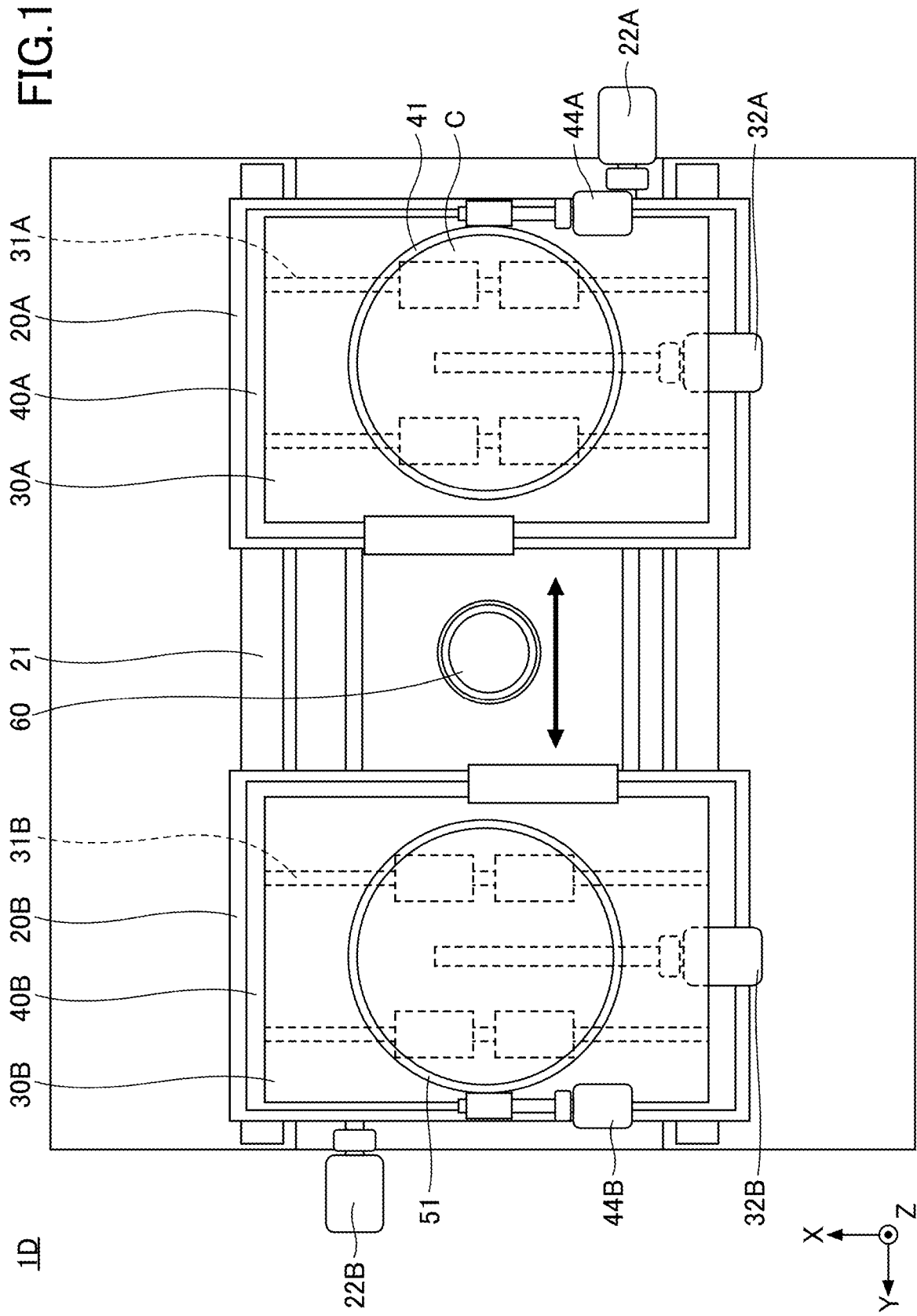
FIG. 19 is a plan view illustrating a configuration of an inspection apparatus according to a fourth embodiment.
Figure 20:
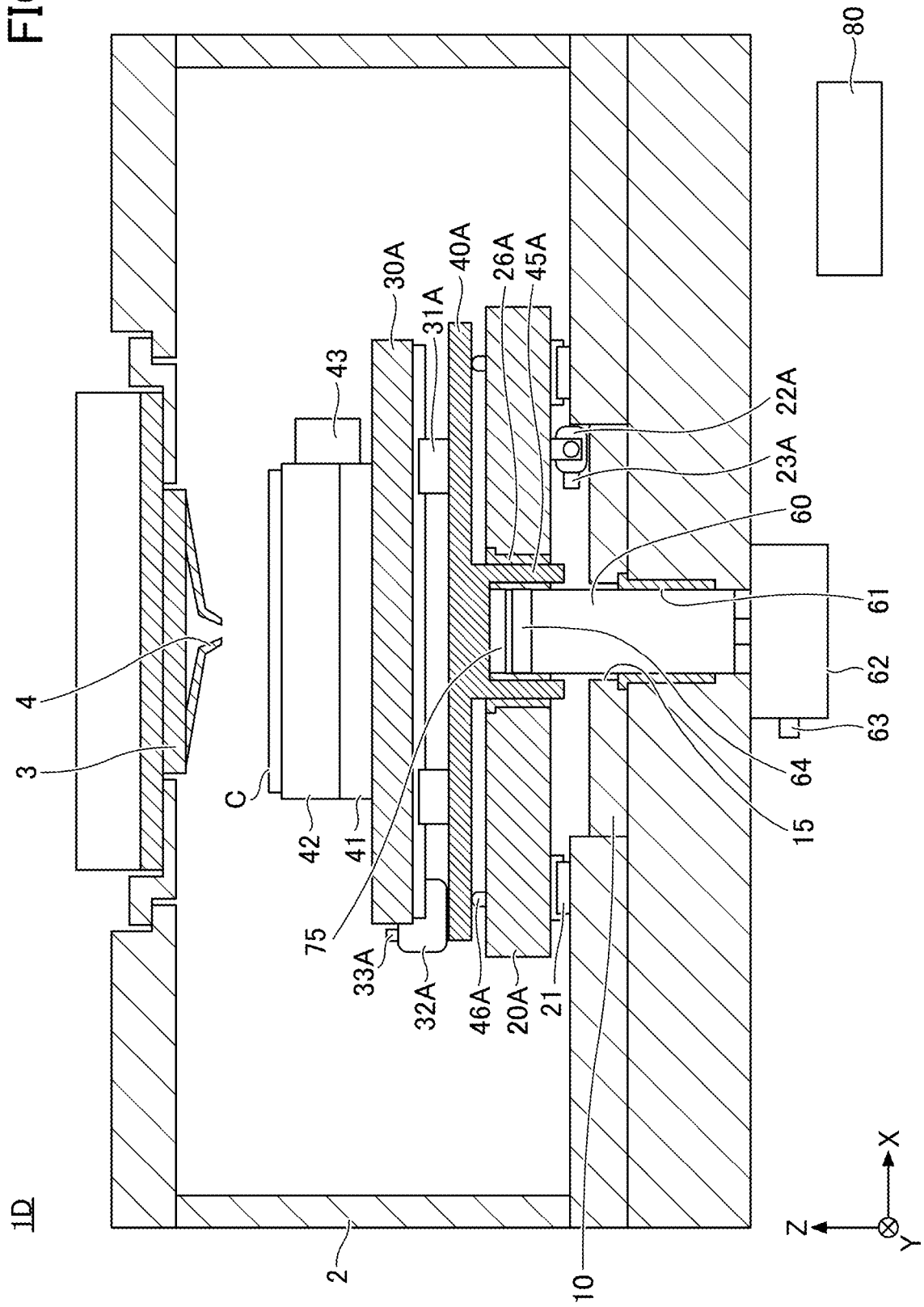
FIG. 20 is a schematic cross-sectional view illustrating the configuration of the inspection apparatus according to the fourth embodiment.
Figure 21:
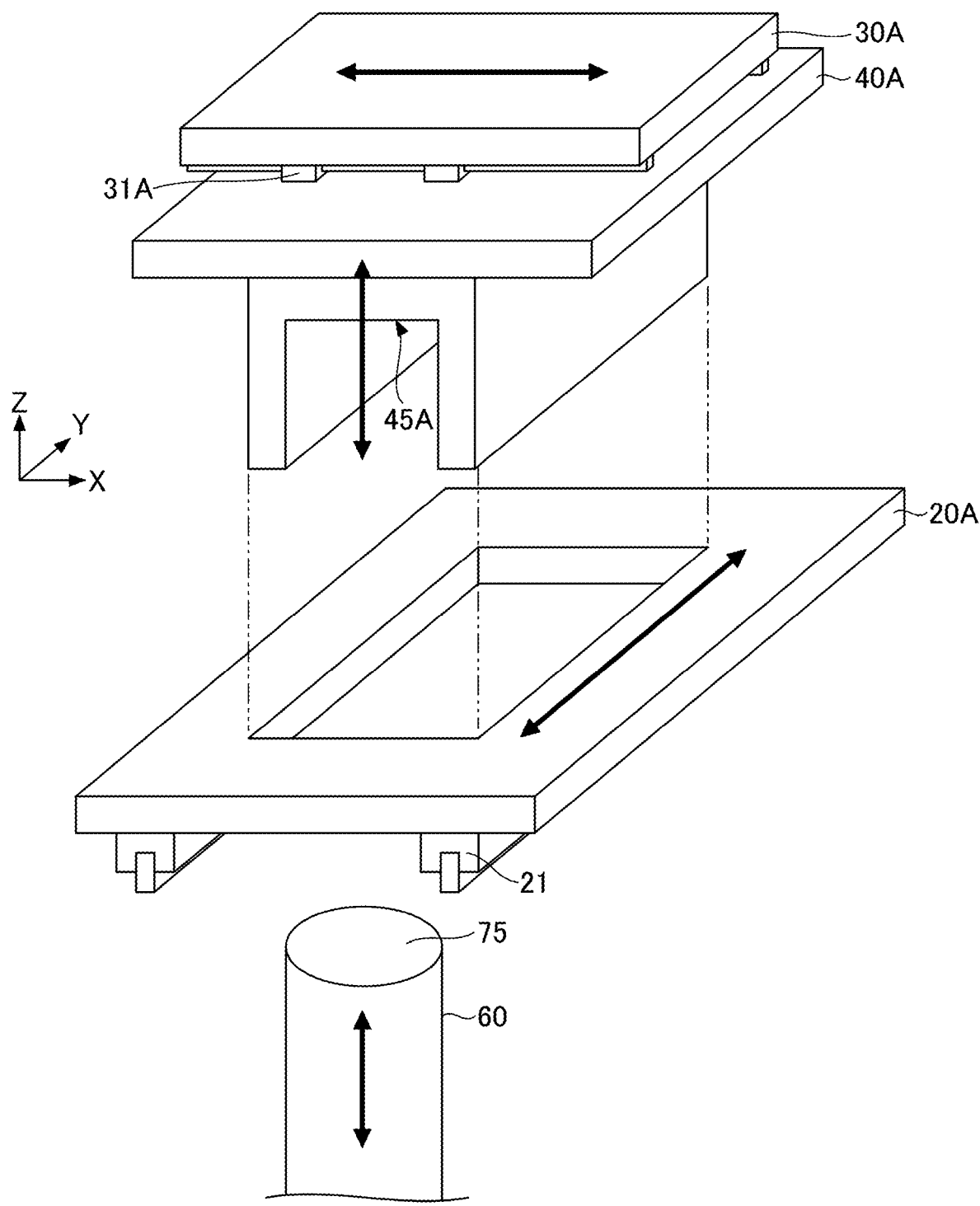
FIG. 21 is an exploded perspective view of the inspection apparatus according to the fourth embodiment.
Figure 22:
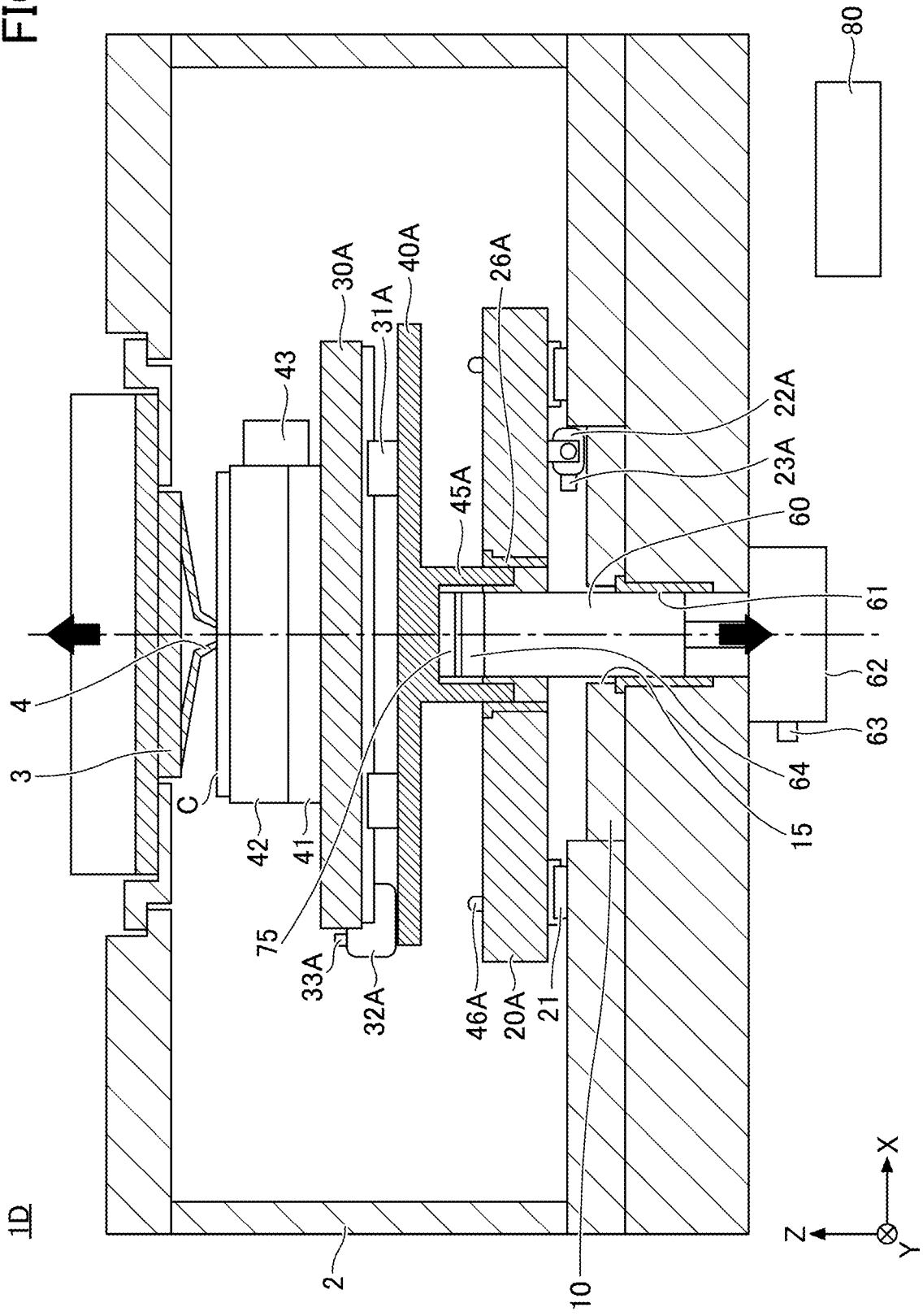
FIG. 22 is a schematic cross-sectional view at the time of inspecting an electronic device at the center of the carrier in an inspection apparatus according to a fourth embodiment.

Next, an inspection apparatus 1D according to a fourth embodiment will be described with reference to FIG. 19 to FIG. 22. FIG. 19 is a plan view illustrating the configuration of the inspection apparatus 1D according to the fourth embodiment. FIG. 20 is a schematic cross-sectional view illustrating the configuration of the inspection apparatus 1D according to the fourth embodiment. FIG. 21 is an exploded perspective view of the inspection apparatus 1D according to the fourth embodiment. FIG. 22 is a schematic cross-sectional view at the time of inspecting an electronic device at the center of the carrier C in the inspection apparatus 1D according to the fourth embodiment. It should be noted that in FIG. 21, the movement directions of the respective portion are indicated by the arrows.

The inspection apparatus 1D is an apparatus that inspects the electrical characteristics for each of a plurality of electronic devices arranged on the carrier C (object to be inspected). It should be noted that the carrier C may include a wafer, a glass substrate, a chip alone, and the like.

The inspection apparatus 1D includes a probe chamber 2. A probe card 3 is arranged at the upper portion in the probe chamber 2. The probe card 3 includes a plurality of probes 4. A stage base 10 is provided with the lower portion of the probe chamber 2. A Y stage 20A, a X stage 30A, an upper Z stage 40A, a θ stage 41, a chuck 42, and a lower camera 43 are provided in the probe chamber 2. Also, a Y stage 20B, a X stage 30B, an upper Z stage 40B, and a needle polishing plate 51 are provided in the probe chamber 2.

The Y stage 20A moves the chuck 42 in the Y axis direction. The Y stage 20A is attached on a stage base 10 via a linear guide 21. The linear guide 21 may include, for example, a guide rail provided on the upper surface of the stage base 10 and extending in the Y axis direction, and a slider provided on the lower surface of the Y stage 20A and sliding along the guide rail. Thus, the Y stage 20A is configured to be movable in the Y direction.

A Y drive mechanism 22A drives the Y stage 20A in the Y direction. For example, the Y drive mechanism 22A may include a motor and a rotary linear motion mechanism (for example, a ball screw) that translates rotational motion of the motor into linear motion. The operation of the motor of the Y drive mechanism 22A is controlled by the controller 80.

A detector 23A detects the position of the Y stage 20A in the Y direction. In other words, the detector 23A detects the position of the chuck 42 in the Y direction. The detector 23A may be, for example, an encoder that detects the rotation of the motor of the Y drive mechanism 22A, and a detection signal of the detector 23A is transmitted to the controller 80. The controller 80 calculates the position of the Y stage 20A in the Y direction based on the detection signal of the detector 23A.

The Y stage 20A has an opening penetrating in the Z axis direction. The opening is provided with a guide 26A.

The upper Z stage 40A has a protrusion 45A that downwardly protrudes. The protrusion 45A of the upper Z stage 40A is inserted into the guide 26A. The upper Z stage 40A is supported by the guide 26A such that the movement of the upper Z stage 40A in the X axis direction and the Y axis direction is restricted and the upper Z stage 40A is insertable and removable in the Z axis direction. Accordingly, the upper Z stage 40A is configured to be movable in the vertical direction with respect to the Y stage 20A. The upper Z stage 40A has the protrusion 45A that downwardly protrudes. Also, the upper surface of the Y stage 20A is provided with stoppers 46A that are in contact with the upper Z stage 40A when the upper Z stage 40A is lowered.

The X stage 30A moves the chuck 42 in the X axis direction. The X stage 30A is attached on the upper Z stage 40A via a linear guide 31A. The linear guide 31A may include, for example, a guide rail provided on the lower surface of the X stage 30A and extending in the X axis direction, and a slider provided on the upper surface of the upper Z stage 40A and sliding along the guide rail. Thus, the X stage 30A is configured to be movable in the X direction. Also, it is preferable that, in a side view in the Y axis direction (see FIG. 20), the slider of the linear guide 31A is arranged symmetrically in the X axis direction from the central axis of the lower Z stage 60.

The X drive mechanism 32A drives the X stage 30A in the X direction. For example, the X drive mechanism 32A may include a motor and a rotary linear motion mechanism (for example, a ball screw) that translates rotational motion of the motor into linear motion. The operation of the motor of the X drive mechanism 32A is controlled by the controller 80.

The detector 33A detects the position of the X stage 30A in the X direction. In other words, the detector 33A detects the position of the chuck 42 in the X direction. The detector 33A may be, for example, an encoder that detects the rotation of the motor of the X drive mechanism 32A, and a detection signal of the detector 33A is transmitted to the controller 80. The controller 80 calculates the position of the X stage 30A in the X direction based on the detection signal of the detector 33A.

The θ stage 41, the chuck 42, and the lower camera 43 are provided on the X stage 30A. The θ stage 41 has a function to rotate the chuck 42 with the Z axis as the rotation axis. The θ drive mechanism 44A that rotates the θ stage 41 is controlled by the controller 80. The chuck 42 carries a carrier C. The chuck 42 has a fixation mechanism (not illustrated) to fix the carrier C to the chuck 42. This prevents the positional deviation of the carrier C with respect to the chuck 42. The lower camera 43 is provided on the side surface of chuck 42. The lower camera 43 moves and rotates together with the chuck 42.

The Y stage 20B moves the needle polishing plate 51 in the Y axis direction. The upper Z stage 40B is configured to move in the vertical direction with respect to the Y stage 20B. The X stage 30B moves the needle polishing plate 51 in the X axis direction. It should be noted that the Y stage 20B, the upper Z stage 40B, and the X stage 30B have configurations similar to those of the Y stage 20A, the upper Z stage 40A, and the X stage 30A, and thus overlapping descriptions thereof will be omitted.

A needle polishing plate 51 is provided on the X stage 30B. The needle polishing plate 51 contacts the tips of the probes 4 to polish the tips of the probes 4. Also, it has a function of rotating the needle polishing plate 51 with the Z axis as the rotation axis. A θ drive mechanism 44B that rotates the needle polishing plate 51 is controlled by the controller 80.

The stage base 10 has an opening 15 that penetrates in the Z axis direction. A guide 61 is provided in the opening 15.

The lower Z stage 60 is supported by the guide 61 such that the movement of the lower Z stage 60 in the X axis direction and the Y axis direction is restricted and the lower Z stage 60 is insertable and removable in the Z axis direction. Thus, the lower Z stage 60 is configured to be movable in the vertical direction with respect to the stage base 10.

The Z drive mechanism 62 drives the lower Z stage 60 in the Z direction. For example, the Z drive mechanism 62 may include a motor and a rotary linear motion mechanism (for example, a ball screw) that translates rotational motion of the motor into linear motion. The operation of the motor of the Z drive mechanism 62 is controlled by the controller 80.

Here, when causing the probes 4 to be in contact with the carrier C mounted on the chuck 42 or the needle polishing plate 51, the axis passing through the position of the center of gravity of the press load of the probe card 3 and the axis passing through the position of the center of gravity of the press load of the lower Z stage 60 are arranged so as to keep on the same axis (see FIG. 22). In other words, the axis passing through the point of action of the pushing force when the lower Z stage 60 pushes up the upper Z stage 40 and the axis passing through the point of action of the load received by the probe card 3 are arranged at positions to be common. Here, axes to be common means that they are on the same axis (the axes match) and that they substantially match (in the same direction). For example, the central axis of the probe card 3 and the central axis of the lower Z stage 60 are common. In addition, the central axis of the probe card 3 and the central axis of the ball screw of the Z drive mechanism 62 are common.

The detector 63 detects the position of the lower Z stage 60 in the X direction. In other words, the detector 63 detects the position in the Z axis direction of the needle polishing plate 51 coupled to the needle polishing plate support stage 50 or the chuck 42 provided on the upper Z stage 40A coupled to the lower Z stage 60. For example, the detector 63 may be an encoder that detects the rotation of the motor of the Z drive mechanism 62, and a detection signal of the detector 63 is transmitted to the controller 80. The controller 80 calculates the position of the lower Z stage 60 in the Z direction based on the detection signal of the detector 63.

The load cell 64 detects a load received by the lower Z stage 60. A detection signal of the load cell 64 is input to the controller 80. It should be noted that a torque sensor that detects the torque of the Z drive mechanism 62 may be used instead of the load cell 64. Also, in a case of feedback controlling the detected load, the controller 80 performs position control and load control at the same time.

The lower portion of the upper Z stage 40A is provided with the movable coupling mechanism 75. The movable coupling mechanism 75 is configured to be switchable between a coupling state in which the upper Z stage 40A and the lower Z stage 60 are coupled and a movable state in which the coupling of the upper Z stage 40A and the lower Z stage 60 is released and the upper Z stage 40A is movable on the stage base 10.

Although an example in which the lower Z stage 60 pushes up the upper Z stage 40A has been described above here, the same applies to a case in which the lower Z stage 60 pushes up the upper Z stage 40B. That is, when the lower Z stage 60 pushes up the upper Z stage 40B, the Y stage 20A is retracted from above the lower Z stage 60 and the Y stage 20B is moved to be located above the lower Z stage 60. In this case, the movable coupling mechanism 75 is configured to be switchable between a coupling state in which the upper Z stage 40B and the lower Z stage 60 are coupled and a movable state in which the coupling of the upper Z stage 40B and the lower Z stage 60 is released and the upper Z stage 40B is movable on the stage base 10.

As described above, according to the inspection apparatus 1D according to the fourth embodiment, not only in a case of causing the probes 4 to be in contact with the center of the carrier C, but also in a case of causing the probes 4 to be in contact with the outer periphery of the carrier C, the axis passing through the position of the center of gravity of the press load of the probe card 3 and the axis passing through the position of the center of gravity of the press load of (the lower Z stage 60) the Z drive mechanism 62 can be kept on the same axis at any time (see FIG. 22). Thereby, even when the contact load is increased, the upper Z stage 40A can be prevented from falling down.

Further, because the slider of the linear guide 31A is provided on the upper surface of the upper Z stage 40A and is arranged symmetrically in the X axis direction from the central axis of the lower Z stage 60, it is possible to prevent the X stage 30A from falling down when pushing up the upper Z stage 40A.

Further, according to the inspection apparatus 1D according to the fourth embodiment, it is possible to prevent the needle polishing plate 51 from falling down. Further, because the upper Z stage 40A, which supports the chuck 42, and the upper Z stage 40B, which supports the needle polishing plate 51, can be lifted and lowered by a single Z drive mechanism 62, the cost of the inspection apparatus 1D can be reduced without individually providing drive mechanisms.

Although the inspection apparatuses 1 and 1A to 1D have been described above, the present disclosure is not limited to the above described embodiments and the like, and various modifications and improvements can be made within the scope of the present disclosure as recited in claims.

What is claimed is:

1. An inspection apparatus comprising:
a probe card having a probe to be in contact with an object to be inspected;
an upper module having a mounting portion on which the object to be inspected is mounted;
a movement mechanism that is configured to support the upper module to be liftable and lowerable and that is able to move the upper module in a horizontal direction; and
a lifting and lowering mechanism that is provided under the movement mechanism and that is able to push up the upper module toward the probe card,
wherein an axis passing through a point of action of a pushing force when the lifting and lowering mechanism pushes up the upper module and an axis passing through a point of action of a load received by the probe card are arranged at positions to be common, the inspection apparatus further comprising:
a needle polishing plate support stage configured to support a needle polishing plate,
wherein the movement mechanism is configured to support the needle polishing plate support stage to be liftable and lowerable independently of the upper module, and
wherein the lifting and lowering mechanism is configured to push the needle polishing plate support stage toward the probe card.

2. The inspection apparatus according to claim 1, further comprising:
a coupling mechanism configured to couple the upper module and the lifting and lowering mechanism to be connectable and removable.

3. The inspection apparatus according to claim 2, wherein the coupling mechanism is configured to couple the upper module and the lifting and lowering mechanism by magnetic adsorption.

4. The inspection apparatus according to claim 2, wherein the coupling mechanism is configured to couple the upper module and the lifting and lowering mechanism by vacuum adsorption.

5. The inspection apparatus according to claim 1, wherein the movement mechanism includes:
a first stage that is movable in a first horizontal direction with respect to a base plate; and
a second stage that is movable in a horizontal second direction different from the first horizontal direction with respect to the first stage,
wherein the upper module is supported by the second stage to be liftable and lowerable, and,
wherein the first stage has an opening.

6. The inspection apparatus according to claim 1, wherein the movement mechanism includes:
a first stage that is movable in a first horizontal direction with respect to a base plate, and
a second stage that is movable in a second horizontal direction different from the first horizontal direction with respect to the upper module,
wherein the upper module is supported by the second stage to be liftable and lowerable, and,
wherein the first stage has an opening.

7. An inspection method of an inspection apparatus, the inspection apparatus including
a probe card having a probe to be in contact with an object to be inspected;
an upper module having a mounting portion on which the object to be inspected is mounted;
a movement mechanism that is configured to support the upper module to be liftable and lowerable and that is able to move the upper module in a horizontal direction; and
a lifting and lowering mechanism that is provided under the movement mechanism and that is able to push up the upper module toward the probe card; and
a controller,
wherein the inspection method includes:
causing the controller to control the movement mechanism to move the object to be inspected,
causing the controller to control the lifting and lowering mechanism to cause the object to be in contact with the probes, where an axis passing through a point of action of a pushing force when the lifting and lowering mechanism pushes up the upper module and an axis passing through a point of action of a load received by the probe card are arranged at positions to be common, the inspection apparatus further comprising:
a needle polishing plate support stage configured to support a needle polishing plate,
wherein the movement mechanism is configured to support the needle polishing plate support stage to be liftable and lowerable independently of the upper module,
wherein the inspection method further includes:
causing the controller to control the lifting and lowering mechanism to push the needle polishing plate support stage toward the probe card.

* * * * *